United States Patent
Banhegyesi et al.

(10) Patent No.: US 10,330,713 B2
(45) Date of Patent: Jun. 25, 2019

(54) INTELLIGENT ELECTRONIC DEVICE HAVING A TOUCH SENSITIVE USER INTERFACE

(71) Applicant: Electro Industries/Gauge Tech, Westbury, NY (US)

(72) Inventors: Tibor Banhegyesi, Baldwin, NY (US); Erran Kagan, Great Neck, NY (US)

(73) Assignee: ELECTRO INDUSTRIES/GAUGE TECH, Westbury, NY (US)

(*) Notice: Subject to any disclaimer, the term of this patent is extended or adjusted under 35 U.S.C. 154(b) by 893 days.

(21) Appl. No.: 13/792,616

(22) Filed: Mar. 11, 2013

(65) Prior Publication Data

US 2014/0180613 A1    Jun. 26, 2014

Related U.S. Application Data

(60) Provisional application No. 61/740,543, filed on Dec. 21, 2012.

(51) Int. Cl.
| | |
|---|---|
| *G01R 21/133* | (2006.01) |
| *G01R 22/06* | (2006.01) |
| *G01R 22/10* | (2006.01) |

(52) U.S. Cl.
CPC .......... *G01R 22/065* (2013.01); *G01R 22/10* (2013.01); *G01R 22/066* (2013.01)

(58) Field of Classification Search
CPC ..... G01R 22/065; G01R 22/10; G01R 22/061
(Continued)

(56) References Cited

U.S. PATENT DOCUMENTS

| | | |
|---|---|---|
| 3,623,087 A | 11/1971 | Gallichotte |
| 3,903,380 A | 9/1975 | Schomburg |
| (Continued) | | |

FOREIGN PATENT DOCUMENTS

| | | |
|---|---|---|
| CA | 2220053 | 11/1996 |
| CN | 2537983 | 2/2003 |
| (Continued) | | |

OTHER PUBLICATIONS

Xu Hong, Wang Jianhua, "An Extendable Data Engine based on OPC Specification", Computer Standards & Interfaces 26 (2004) 515-525; Dec. 5, 2003.

(Continued)

*Primary Examiner* — Mohamed Charioui
*Assistant Examiner* — Eyob Hagos
(74) *Attorney, Agent, or Firm* — Gerald E. Hespos; Michael J. Porco; Matthew T. Hespos

(57) ABSTRACT

An intelligent electronic device (IED) having a touch sensitive user interface is provided. The intelligent electronic device includes a housing; at least one sensor coupled to the electric circuit and configured to measure at least one parameter of the electrical circuit and generate at least one analog signal indicative of the at least one parameter; at least one analog to digital converter coupled to the at least one sensor and configured to receive the at least one analog signal and convert the at least one analog signal to at least one digital signal; at least one processor configured to receive the at least one digital signal and calculate at least one power parameter of the electrical circuit; and an user interface configured to receive input from a user, the user interface including at least one touch sensitive sensor configured to detect the user input.

32 Claims, 15 Drawing Sheets

(58) Field of Classification Search
USPC .......................................................... 702/61
See application file for complete search history.

(56) References Cited

U.S. PATENT DOCUMENTS

| | | | |
|---|---|---|---|
| 3,906,491 A | 9/1975 | Gosswiller et al. | |
| 3,983,554 A | 9/1976 | Goode | |
| 4,060,803 A | 11/1977 | Ashworth, Jr. | |
| 4,415,896 A | 11/1983 | Allgood | |
| 4,697,180 A | 9/1987 | Swanson | |
| 4,697,182 A | 9/1987 | Swanson | |
| 4,700,188 A | 10/1987 | James | |
| 4,757,263 A | 7/1988 | Cummings, III et al. | |
| 5,097,581 A * | 3/1992 | Williams | G01R 11/04 29/267 |
| 5,206,595 A | 4/1993 | Wiggins et al. | |
| 5,270,639 A * | 12/1993 | Moore | G01R 11/02 324/103 R |
| 5,426,688 A | 6/1995 | Anand | |
| 5,438,607 A | 8/1995 | Przygoda, Jr. et al. | |
| 5,457,289 A * | 10/1995 | Huang | G06F 3/044 178/18.06 |
| 5,469,365 A | 11/1995 | Diekema et al. | |
| 5,475,557 A | 12/1995 | Larom et al. | |
| 5,537,327 A | 7/1996 | Snow et al. | |
| 5,600,524 A | 2/1997 | Neiger et al. | |
| 5,650,936 A | 7/1997 | Loucks et al. | |
| 5,661,802 A | 8/1997 | Nilssen | |
| 5,684,710 A | 11/1997 | Ehlers et al. | |
| 5,706,204 A | 1/1998 | Cox et al. | |
| 5,719,564 A | 2/1998 | Sears | |
| 5,736,847 A | 4/1998 | Van Doorn et al. | |
| 5,764,155 A | 6/1998 | Kertesz et al. | |
| 5,768,148 A | 6/1998 | Murphy et al. | |
| 5,796,742 A | 8/1998 | Klotzbach et al. | |
| 5,828,576 A | 10/1998 | Loucks et al. | |
| 5,828,978 A | 10/1998 | Anand et al. | |
| 5,838,589 A | 11/1998 | Nail et al. | |
| 5,862,391 A | 1/1999 | Salas et al. | |
| 5,963,406 A | 10/1999 | Neiger et al. | |
| 5,982,596 A | 11/1999 | Spencer et al. | |
| 5,995,911 A | 11/1999 | Hart et al. | |
| 6,000,034 A | 12/1999 | Lightbody et al. | |
| 6,005,758 A | 12/1999 | Spencer et al. | |
| 6,005,759 A | 12/1999 | Hart et al. | |
| 6,043,642 A | 3/2000 | Martin et al. | |
| D427,533 S | 7/2000 | Cowan et al. | |
| D429,655 S | 8/2000 | Cowan et al. | |
| 6,147,616 A | 11/2000 | Kim | |
| D435,471 S | 12/2000 | Simbeck et al. | |
| 6,157,527 A | 12/2000 | Spencer et al. | |
| 6,185,508 B1 | 2/2001 | Van Doorn et al. | |
| 6,186,842 B1 | 2/2001 | Hirschbold et al. | |
| 6,195,243 B1 | 2/2001 | Spencer et al. | |
| D439,535 S | 3/2001 | Cowan et al. | |
| 6,212,049 B1 | 4/2001 | Spencer et al. | |
| 6,219,046 B1 | 4/2001 | Thomas et al. | |
| 6,236,949 B1 | 5/2001 | Hart et al. | |
| D443,541 S | 6/2001 | Hancock et al. | |
| 6,297,742 B1 | 10/2001 | Canada et al. | |
| 6,366,301 B1 | 4/2002 | Thomas et al. | |
| 6,377,283 B1 | 4/2002 | Thomas | |
| 6,380,949 B2 | 4/2002 | Thomas et al. | |
| 6,397,155 B1 | 5/2002 | Przydatek et al. | |
| D458,863 S | 6/2002 | Harding et al. | |
| D459,259 S | 6/2002 | Harding et al. | |
| 6,421,214 B1 | 7/2002 | Packard et al. | |
| 6,493,644 B1 | 12/2002 | Jonker et al. | |
| 6,563,697 B1 | 5/2003 | Simback et al. | |
| 6,567,404 B1 | 5/2003 | Wilford | |
| 6,578,084 B1 | 6/2003 | Moberg et al. | |
| 6,611,773 B2 | 8/2003 | Przydatek et al. | |
| 6,611,922 B2 | 8/2003 | Ozcetin et al. | |
| 6,615,147 B1 | 9/2003 | Jonker et al. | |
| 6,636,030 B1 | 10/2003 | Rose et al. | |
| 6,671,635 B1 | 12/2003 | Forth et al. | |
| 6,671,654 B1 | 12/2003 | Forth et al. | |
| 6,687,627 B1 | 2/2004 | Gunn et al. | |
| 6,694,270 B2 | 2/2004 | Hart et al. | |
| 6,735,535 B1 | 5/2004 | Kagan et al. | |
| 6,737,855 B2 | 5/2004 | Huber et al. | |
| 6,745,138 B2 | 6/2004 | Przydatek et al. | |
| 6,751,562 B1 | 6/2004 | Blackett et al. | |
| 6,751,563 B2 | 6/2004 | Spanier et al. | |
| 6,792,337 B2 | 9/2004 | Blackett et al. | |
| 6,792,364 B2 | 9/2004 | Jonker et al. | |
| 6,798,190 B2 | 9/2004 | Harding et al. | |
| 6,798,191 B1 | 9/2004 | Macfarlane et al. | |
| 6,813,571 B2 | 11/2004 | Lightbody et al. | |
| 6,819,098 B2 | 11/2004 | Villicana et al. | |
| 6,825,776 B2 | 11/2004 | Lightbody et al. | |
| 6,853,978 B2 | 2/2005 | Forth et al. | |
| 6,871,150 B2 | 3/2005 | Huber et al. | |
| 6,885,185 B1 * | 4/2005 | Makinson | G01R 22/066 324/142 |
| D505,087 S | 5/2005 | Ricci et al. | |
| 6,894,979 B1 | 5/2005 | Lee et al. | |
| 6,901,299 B1 | 5/2005 | Whitehead et al. | |
| 6,944,555 B2 | 9/2005 | Blackett et al. | |
| 6,957,158 B1 | 10/2005 | Hancock et al. | |
| 6,961,641 B1 | 11/2005 | Forth et al. | |
| 6,983,211 B2 | 1/2006 | Macfarlene et al. | |
| 6,988,025 B2 | 1/2006 | Ransom et al. | |
| 6,988,182 B2 | 1/2006 | Teachman et al. | |
| 6,990,121 B1 | 1/2006 | Stiles et al. | |
| 6,990,395 B2 | 1/2006 | Ransom et al. | |
| 7,006,934 B2 | 2/2006 | Jonker et al. | |
| 7,010,438 B2 | 3/2006 | Hancock et al. | |
| 7,072,779 B2 | 7/2006 | Hancock et al. | |
| 7,085,824 B2 | 8/2006 | Forth et al. | |
| 7,089,089 B2 | 8/2006 | Cumming et al. | |
| 7,127,328 B2 | 10/2006 | Ransom et al. | |
| D532,747 S | 11/2006 | Ricci et al. | |
| 7,135,988 B2 | 11/2006 | Kawai et al. | |
| 7,136,384 B1 | 11/2006 | Wang et al. | |
| D534,120 S | 12/2006 | Ricci et al. | |
| 7,155,350 B2 | 12/2006 | Kagan et al. | |
| 7,158,050 B2 | 1/2007 | Lightbody et al. | |
| 7,174,258 B2 | 2/2007 | Hart et al. | |
| 7,174,261 B2 | 2/2007 | Gunn et al. | |
| 7,184,904 B2 | 2/2007 | Kagan et al. | |
| 7,188,003 B2 | 3/2007 | Ransom et al. | |
| 7,191,076 B2 | 3/2007 | Huber et al. | |
| 7,216,043 B2 | 5/2007 | Ransom et al. | |
| 7,246,014 B2 | 7/2007 | Forth et al. | |
| 7,248,977 B2 | 7/2007 | Hart et al. | |
| 7,248,978 B2 | 7/2007 | Ransom et al. | |
| 7,249,265 B2 | 7/2007 | von Carolsfeld et al. | |
| 7,256,709 B2 | 8/2007 | Kagan et al. | |
| 7,262,709 B2 | 8/2007 | Borleske et al. | |
| 7,271,996 B2 | 9/2007 | Kagan et al. | |
| 7,294,997 B2 | 11/2007 | Kagan et al. | |
| 7,304,586 B2 | 12/2007 | Wang et al. | |
| 7,305,310 B2 | 12/2007 | Slota et al. | |
| 7,319,574 B2 | 1/2008 | Engel | |
| 7,337,081 B1 | 2/2008 | Kagan et al. | |
| 7,415,725 B2 | 8/2008 | Henneberry et al. | |
| 7,486,081 B2 | 2/2009 | Kalokitis et al. | |
| 7,516,106 B2 | 4/2009 | Ehlers et al. | |
| 7,535,687 B2 | 5/2009 | Costa | |
| 7,561,926 B2 | 7/2009 | Garcia-Ortiz | |
| 7,567,174 B2 | 7/2009 | Woodard et al. | |
| 7,570,469 B2 | 8/2009 | Guzman-Casillas et al. | |
| 7,576,635 B2 | 8/2009 | Bender et al. | |
| 7,609,719 B2 | 10/2009 | Kagan et al. | |
| 7,612,654 B2 | 11/2009 | Bender et al. | |
| 7,616,656 B2 | 11/2009 | Wang et al. | |
| 7,627,453 B2 | 12/2009 | Keefe et al. | |
| RE41,871 E | 10/2010 | Capowski et al. | |
| 7,982,600 B2 | 7/2011 | Gavrilla et al. | |
| 8,040,234 B2 | 10/2011 | Ebrom et al. | |
| 8,107,491 B2 | 1/2012 | Wang et al. | |
| 8,442,660 B2 | 7/2013 | Kagan | |
| 9,322,669 B2 | 4/2016 | Kagan | |

(56) References Cited

U.S. PATENT DOCUMENTS

| | | |
|---|---|---|
| 2001/0010032 A1 | 7/2001 | Ehlers et al. |
| 2002/0032535 A1 | 3/2002 | Alexander et al. |
| 2002/0035497 A1 | 3/2002 | Mazereeuw et al. |
| 2002/0114326 A1 | 8/2002 | Mahalingaiah |
| 2002/0120723 A1 | 8/2002 | Forth et al. |
| 2002/0162014 A1 | 10/2002 | Przydatek et al. |
| 2002/0165677 A1 | 11/2002 | Lightbody et al. |
| 2002/0169570 A1 | 11/2002 | Spanier et al. |
| 2002/0191640 A1 | 12/2002 | Haymes et al. |
| 2003/0014200 A1 | 1/2003 | Jonker et al. |
| 2003/0040897 A1 | 2/2003 | Murphy et al. |
| 2003/0065459 A1 | 4/2003 | Huber et al. |
| 2003/0066311 A1 | 4/2003 | Li et al. |
| 2003/0067490 A1 | 4/2003 | Murakami |
| 2003/0076242 A1 | 4/2003 | Burns et al. |
| 2003/0085715 A1 | 5/2003 | Lubkeman et al. |
| 2003/0101008 A1 | 5/2003 | Hart et al. |
| 2003/0105608 A1 | 6/2003 | Hart et al. |
| 2003/0132742 A1 | 7/2003 | Harding et al. |
| 2003/0147420 A1 | 8/2003 | Beckwith |
| 2003/0154471 A1 | 8/2003 | Teachman et al. |
| 2003/0176952 A1 | 9/2003 | Collins et al. |
| 2003/0177440 A1 | 9/2003 | Kegoya et al. |
| 2003/0210699 A1 | 11/2003 | Holt, Sr. et al. |
| 2003/0212512 A1 | 11/2003 | Hart et al. |
| 2003/0220752 A1 | 11/2003 | Hart et al. |
| 2004/0037313 A1 | 2/2004 | Gulati et al. |
| 2004/0066311 A1 | 4/2004 | Giles et al. |
| 2004/0104826 A1* | 6/2004 | Philipp .................. G01D 5/24 341/34 |
| 2004/0138786 A1 | 7/2004 | Blackett et al. |
| 2004/0138787 A1 | 7/2004 | Ransom et al. |
| 2004/0138835 A1 | 7/2004 | Ransom et al. |
| 2004/0172207 A1 | 9/2004 | Hancock et al. |
| 2004/0183522 A1 | 9/2004 | Gunn et al. |
| 2004/0229578 A1 | 11/2004 | Lightbody et al. |
| 2005/0002417 A1 | 1/2005 | Kelly et al. |
| 2005/0017874 A1 | 1/2005 | Lightbody et al. |
| 2005/0027464 A1 | 2/2005 | Jonker et al. |
| 2005/0049753 A1 | 3/2005 | Garcia-Ortiz |
| 2005/0071106 A1 | 3/2005 | Huber et al. |
| 2005/0093708 A1 | 5/2005 | Dupeire |
| 2005/0114361 A1 | 5/2005 | Roberts et al. |
| 2005/0222784 A1 | 10/2005 | Tuff et al. |
| 2005/0256964 A1 | 11/2005 | Dube |
| 2005/0275397 A1 | 12/2005 | Lightbody et al. |
| 2005/0288876 A1 | 12/2005 | Doing et al. |
| 2005/0288877 A1 | 12/2005 | Doing et al. |
| 2006/0016201 A1 | 1/2006 | Kopel |
| 2006/0052958 A1 | 3/2006 | Hancock et al. |
| 2006/0071813 A1 | 4/2006 | Kagan et al. |
| 2006/0077999 A1 | 4/2006 | Kagan et al. |
| 2006/0086893 A1 | 4/2006 | Spanier et al. |
| 2006/0158438 A1 | 7/2006 | Hunter |
| 2006/0161400 A1 | 7/2006 | Kagan et al. |
| 2006/0170409 A1 | 8/2006 | Kagan et al. |
| 2006/0187956 A1 | 8/2006 | Dovial et al. |
| 2006/0230394 A1 | 10/2006 | Forth et al. |
| 2006/0238364 A1 | 10/2006 | Keefe et al. |
| 2006/0238520 A1 | 10/2006 | Westerman et al. |
| 2006/0271244 A1 | 11/2006 | Cumming et al. |
| 2007/0038394 A1 | 2/2007 | Gagnon et al. |
| 2007/0067119 A1 | 3/2007 | Loewen et al. |
| 2007/0067121 A1 | 3/2007 | Przydatek et al. |
| 2007/0070050 A1 | 3/2007 | Westerman et al. |
| 2007/0081726 A1 | 4/2007 | Westerman et al. |
| 2007/0096942 A1 | 5/2007 | Kagan et al. |
| 2007/0136010 A1 | 6/2007 | Gunn et al. |
| 2008/0046205 A1 | 2/2008 | Gilbert et al. |
| 2008/0065335 A1 | 3/2008 | Doig et al. |
| 2008/0077336 A1 | 3/2008 | Fernandes |
| 2008/0154523 A1 | 6/2008 | Gilbert et al. |
| 2009/0096654 A1 | 4/2009 | Zhu et al. |
| 2009/0199084 A1 | 8/2009 | Motohashi |
| 2009/0235156 A1 | 9/2009 | Wake et al. |
| 2009/0265124 A1* | 10/2009 | Kagan .................. G01R 22/063 702/62 |
| 2010/0046545 A1 | 2/2010 | Kagan et al. |
| 2010/0238983 A1* | 9/2010 | Banhegyesi ....... H04B 10/2504 375/214 |
| 2011/0035338 A1* | 2/2011 | Kagan .................. G01D 4/002 705/412 |
| 2012/0074927 A1* | 3/2012 | Ramirez .............. G01R 22/066 324/110 |
| 2012/0161950 A1* | 6/2012 | Heron .................. G01D 7/007 340/407.2 |
| 2012/0228529 A1* | 9/2012 | Trewin .................. H01F 38/14 250/551 |
| 2012/0242498 A1* | 9/2012 | Ree ........................ G01D 11/24 340/870.02 |
| 2013/0207929 A1* | 8/2013 | Farmer ................ G01R 13/029 345/174 |
| 2013/0293482 A1* | 11/2013 | Burns .................. B81B 7/0006 345/173 |

FOREIGN PATENT DOCUMENTS

| | | |
|---|---|---|
| GB | 1438271 | 6/1976 |
| GB | 2317278 | 3/1998 |
| WO | 8707993 | 12/1987 |
| WO | 0237653 | 5/2002 |
| WO | 03003326 | 1/2003 |
| WO | 2006047583 | 5/2006 |

OTHER PUBLICATIONS

QT1106 Data Sheet; Quantum Research Group, Pittsburgh, PA; Copyright 2006-2007 QRG Ltd.; 24 pages.

* cited by examiner

INTELLIGENT ELECTRONIC DEVICE HAVING A TOUCH SENSITIVE USER INTERFACE

PRIORITY

This application claims priority to U.S. Provisional Patent Application No. 61/740,543 filed Dec. 21, 2012, entitled "INTELLIGENT ELECTRONIC DEVICE HAVING A TOUCH SENSITIVE USER INTERFACE", the contents of which are hereby incorporated by reference in its entirety.

BACKGROUND

Field

The present disclosure relates generally to intelligent electronic devices (IEDs) for electrical power systems, and more particularly, to a touch sensitive user interface for an intelligent electronic device.

Description of the Related Art

Electric utility companies ("utilities") track electric usage by customers by using power meters, also known as IEDS. These meters track the amount of power consumed at a particular location. These locations range from power substations, to commercial businesses, to residential homes. The electric utility companies use information obtained from the power meter to charge its customers for their power consumption, i.e., revenue metering.

A popular type of power meter is the socket-type power meter, i.e., S-base or Type S meter. As its name implies, the meter itself plugs into a socket for easy installation, removal and replacement. Other meter installations include panel mounted, switchboard mounted, and circuit breaker mounted. Additional meter forms include switchboard drawout forms, substation panel metering forms, and A-base front wired forms. Typically, the power meter connects between utility power lines supplying electricity and a usage point, namely, a residence or commercial place of business.

A power meter may also be placed at a point within the utility's power grid to monitor power flowing through that point for distribution, power loss, or capacity monitoring, e.g., a substation. These power and energy meters are installed in substations to provide a visual display of real-time data and to alarm when problems occur. These problems include limit alarms, breaker control, outages and many other types of events. Conventionally, the visual display includes numerical information and/or an alarm indication, e.g., a LED, on the face of the meter.

SUMMARY

An intelligent electronic device (IED) having a touch sensitive user interface is provided.

According to one aspect of the present disclosure, an intelligent electronic device for monitoring power usage of an electrical circuit is provided including a housing; at least one sensor coupled to the electric circuit and configured to measure at least one parameter of the electrical circuit and generate at least one analog signal indicative of the at least one parameter; at least one analog to digital converter coupled to the at least one sensor and configured to receive the at least one analog signal and convert the at least one analog signal to at least one digital signal; at least one processor configured to receive the at least one digital signal and calculate at least one power parameter of the electrical circuit; and an user interface configured to receive input from a user, the user interface including at least one touch sensitive sensor configured to detect the user input.

In another aspect, the user interface further includes a display configured to display measured and calculated data. In a further aspect, the at least one touch sensitive sensor is transparent and disposed over the display.

In another aspect, the at least one touch sensitive sensor is a charge-transfer capacitive sensor.

In a further aspect, the at least one touch sensitive sensor is a surface capacitance sensor.

In yet another aspect, the at least one touch sensitive sensor is a projected capacitance sensor.

In a further aspect, the at least one touch sensitive sensor is a resistive sensor.

In a still further aspect, the at least one touch sensitive sensor is an optical sensor.

In another aspect, the at least one touch sensitive sensor is an acoustic wave sensor.

In a further aspect, the housing may be a panel meter type housing, a switchboard type meter housing or a A-base type meter housing.

According to another aspect of the present disclosure, a socket based revenue meter includes a generally cylindrical housing; a base coupled to the housing including at least one terminal mateable with matching jaws of a detachable meter mounting device for connecting the meter to a power line of a power distribution system; at least one sensor coupled to at least one terminal configured for measuring at least one parameter of the power line and generating at least one analog signal indicative of the at least one parameter; at least one analog to digital converter coupled to the at least one sensor configured for receiving the at least one analog signal and converting the at least one analog signal to at least one digital signal; at least one processor configured for receiving the at least one digital signal and calculating energy consumption in the electrical circuit; and an user interface configured to receive input from a user, the user interface including at least one touch sensitive sensor configured to detect the user input.

BRIEF DESCRIPTION OF THE DRAWINGS

The above and other aspects, features, and advantages of the present disclosure will become more apparent in light of the following detailed description when taken in conjunction with the accompanying drawings.

Figure 1:
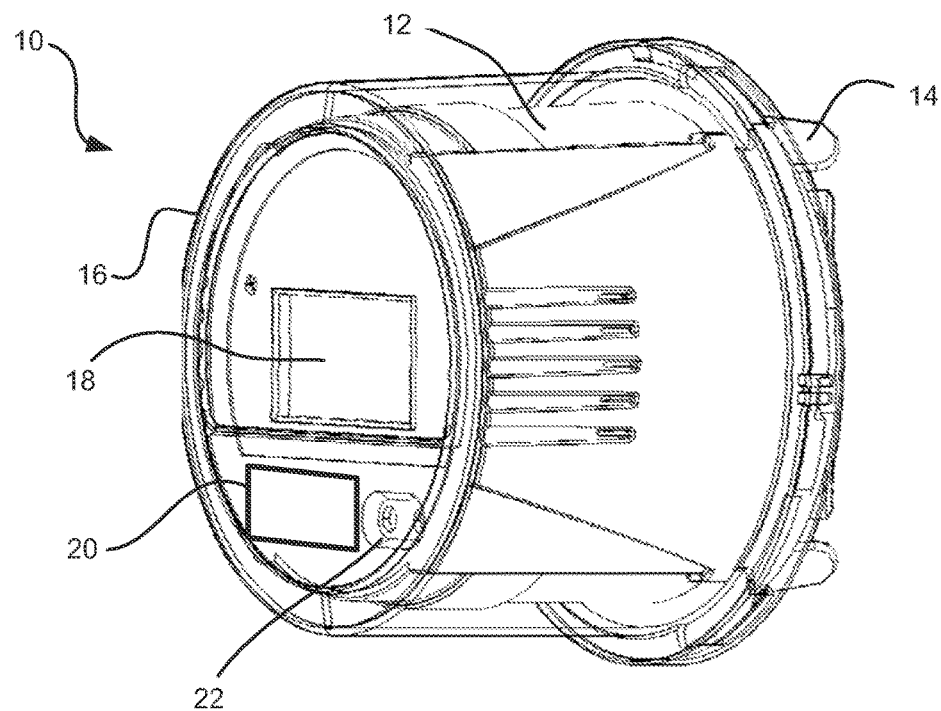
FIG. 1 is a front perspective view of a socket based revenue meter in accordance with an embodiment of present disclosure.

To facilitate understanding, identical reference numerals have been used, where possible, to designate identical elements that are common to the figures, except that alphanumerical suffixes may be added, when appropriate, to differentiate such elements. The images in the drawings are simplified for illustrative purposes and are not depicted to scale.

The appended drawings illustrate exemplary embodiments of the present disclosure and, as such, should not be considered as limiting the scope of the disclosure that may admit to other equally effective embodiments. Correspondingly, it has been contemplated that features or steps of one embodiment may beneficially be incorporated in other embodiments without further recitation.

In some embodiments, particular method steps of the discussed methods are performed in the depicted order. In alternate embodiments, in the respective methods, at least two method steps or portions thereof may be performed contemporaneously, in parallel, or in a different order.

DETAILED DESCRIPTION

It should be understood that the elements shown in the figures may be implemented in various forms of hardware, software or combinations thereof. Preferably, these elements are implemented in a combination of hardware and software on one or more appropriately programmed general-purpose devices, which may include a processor, memory and input/output interfaces, programmable logic or other device or devices.

The present description illustrates the principles of the present disclosure. It will thus be appreciated that those skilled in the art will be able to devise various arrangements that, although not explicitly described or shown herein, embody the principles of the disclosure and are included within its spirit and scope.

All examples and conditional language recited herein are intended for pedagogical purposes to aid the reader in understanding the principles of the disclosure and the concepts contributed by the inventor(s) to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the principles of the disclosure. Similarly, it will be appreciated that any flow charts, flow diagrams, state transition diagrams, pseudo-code, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read only memory ("ROM") for storing software, random access memory ("RAM"), and nonvolatile storage, programmable logic or other device or devices.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

Aspects of the present disclosure are illustratively described herein within the context of intelligent electronic devices ("IEDs") such as power quality analyzers, including portable and accuracy certifiable power quality analyzers. The term "power quality analyzers" is broadly used herein in reference to IEDs adapted to record, measure, and communicate at least some of parameters of waveforms of voltages and currents of a respective electrical service, including their harmonics, transients, ripples, and other disturbances. The term "portable" is used in reference to the power quality analyzers to denote transportability of such IEDs and ability thereof for momentarily, temporary, and permanent connectivity to respective electrical services and communication networks.

As used herein, intelligent electronic devices ("IED's") include Programmable Logic Controllers ("PLC's"), Remote Terminal Units ("RTU's"), electric power meters, protective relays, fault recorders and other devices which are coupled with power distribution networks to manage and control the quality, distribution and consumption of electrical power. A meter is a device that records and measures power events, power quality, current, voltage waveforms, harmonics, transients and other power disturbances. Revenue accurate meters ("revenue meters") relate to revenue accuracy electrical power metering devices with the ability to detect, monitor, report, quantify and communicate power quality information about the power which they are metering.

The word "exemplary" is used herein to mean "serving as an example, instance, or illustration." Any configuration or design described herein as "exemplary" is not necessarily to be construed as preferred or advantageous over other configurations or designs. Herein, the phrase "coupled with" is defined to mean directly connected to or indirectly connected with through one or more intermediate components. Such intermediate components may include both hardware and software based components.

Figure 2:
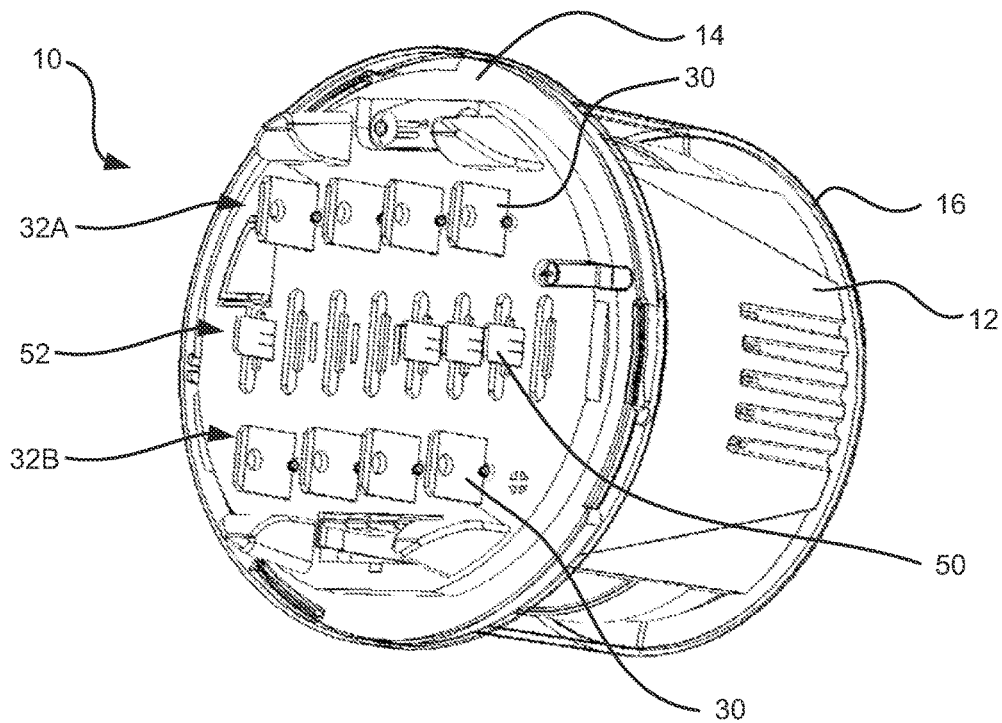
FIG. 2 is a rear perspective view of the socket based revenue meter shown in FIG. 1 in accordance with an embodiment of present disclosure.

Referring to the FIGS. 1 and 2, a socket based revenue meter 10 is provided, also known as an S-base meter. Although the meter shown in the Figures is configured as an ANSI 9S/36S form meter, the teachings of the present disclosure may be applied to other forms of socket based meters such as 45S and the like.

The meter 10 includes a main housing 12 with a base 14 for coupling the meter 10 to a meter socket. The main housing 12 is surrounded by a generally cylindrical cover 16 having an open end and a closed end. The cover 16 is preferably made of a clear material to expose a display 18 disposed on the main body or housing 12. An interface 20 to access the display and a communication port 22 is also provided and accessible through the cover 16.

The meter 10 includes a plurality of current terminals 30 and voltage terminals 50 disposed on backside of the meter and extending through the base 14. In the embodiment illustrated, current terminals 30 are disposed in two rows 32a and 32b of four current terminals each. Four voltage terminals 50 are disposed in single row 52. As will be noted, current terminals 30 feature meter knives or stabs that are substantially larger than meter knives or stabs corresponding to voltage terminals 50. The larger size of current terminals 30 is required to permit large currents to be sensed accurately thereby. It will be recognized by those skilled in the art that in other embodiments the meter knives or stabs may be used in other arrangements. For example, depending on the form factor, the terminals 30 may be used as voltage terminals. The terminals 30, 50 may be used in any other suitable combination of voltage and current terminals or for other purposes.

The terminals 30, 50 are designed to mate with matching jaws of a detachable meter-mounting device, such as a revenue meter socket. The socket is hard wired to the electrical circuit and is not meant to be removed. A socket-sealing ring (not shown) is used as a seal between the meter base 14 and/or cover 16 and the meter socket to prevent removal of the meter and to indicate tampering with the meter. To install an S-base meter, the utility need only plug in the meter 10 into the socket. This makes installation of new meters and especially replacement of defective meters extremely simple. Once installed, the installer need only secure the sealing ring, which ensures that the meter will not be tampered with (as detailed in the ANSI standards). To remove the meter 10, the installer need only pull it out of the socket.

Figure 3:
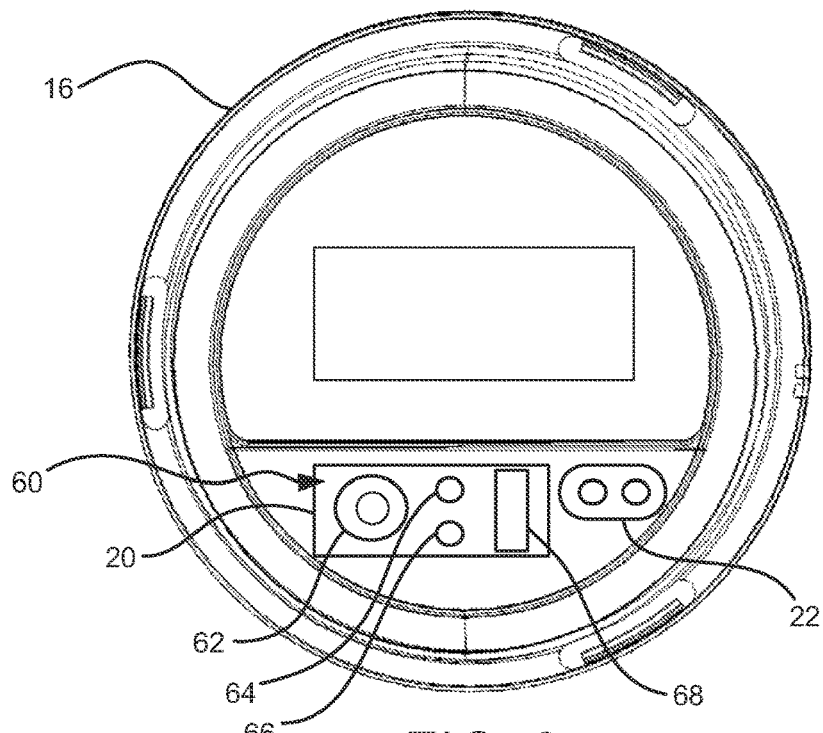
FIG. 3 is a front view of a cover for a socket based revenue meter in accordance with an embodiment of present disclosure.
Figure 4:
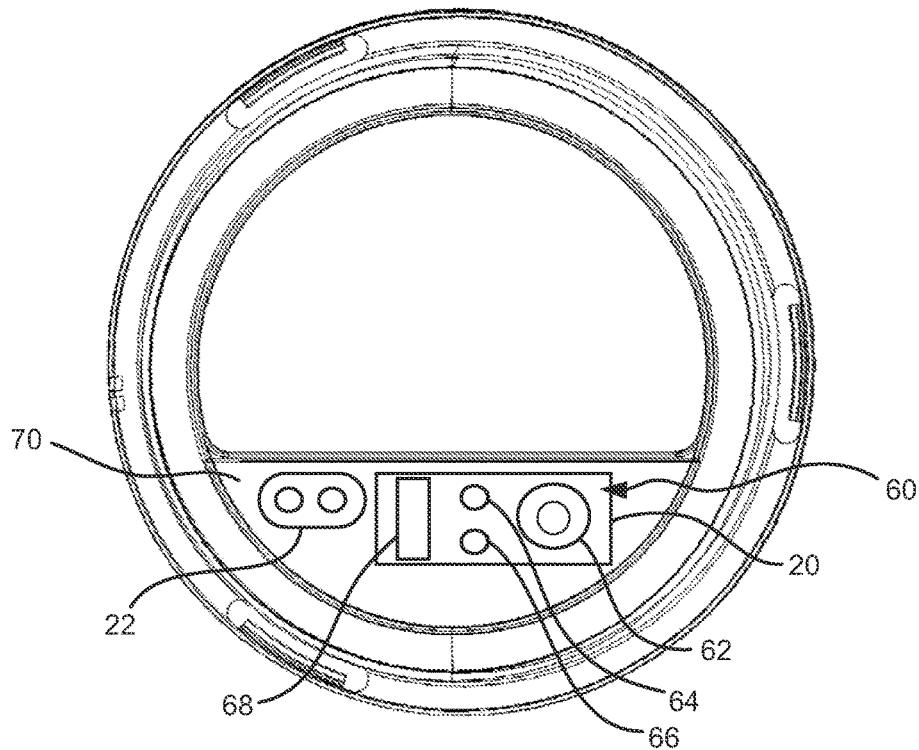
FIG. 4 is a rear view of a cover for a socket based revenue meter in accordance with an embodiment of present disclosure.
Figure 5:
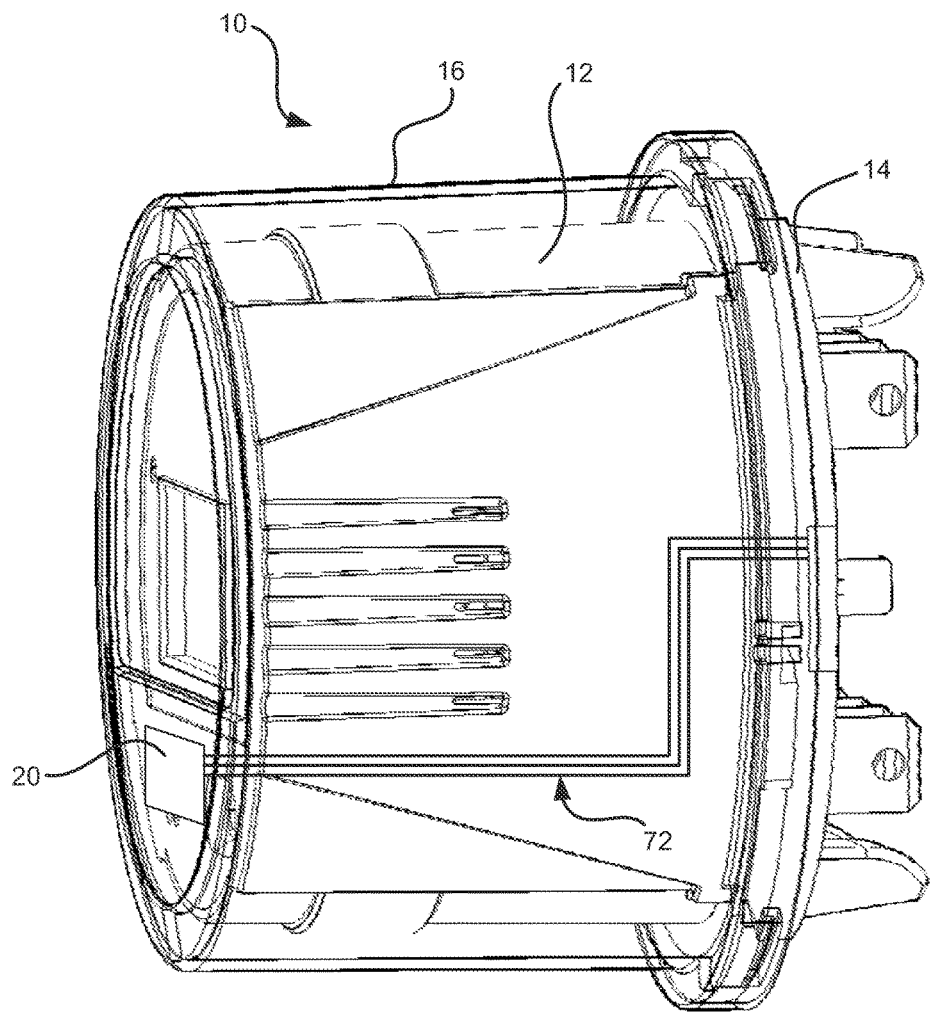
FIG. 5 is a side perspective view of a socket based revenue meter in accordance with an embodiment of present disclosure.
Figure 6:
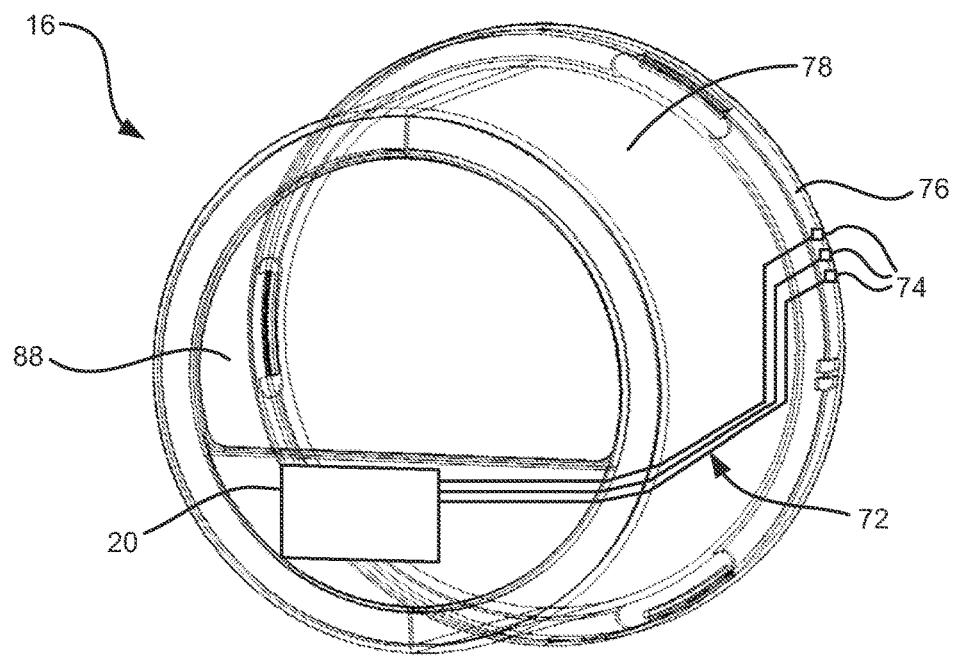
FIG. 6 is a front perspective view of a cover for a socket based revenue meter in accordance with an embodiment of present disclosure.
Figure 7:
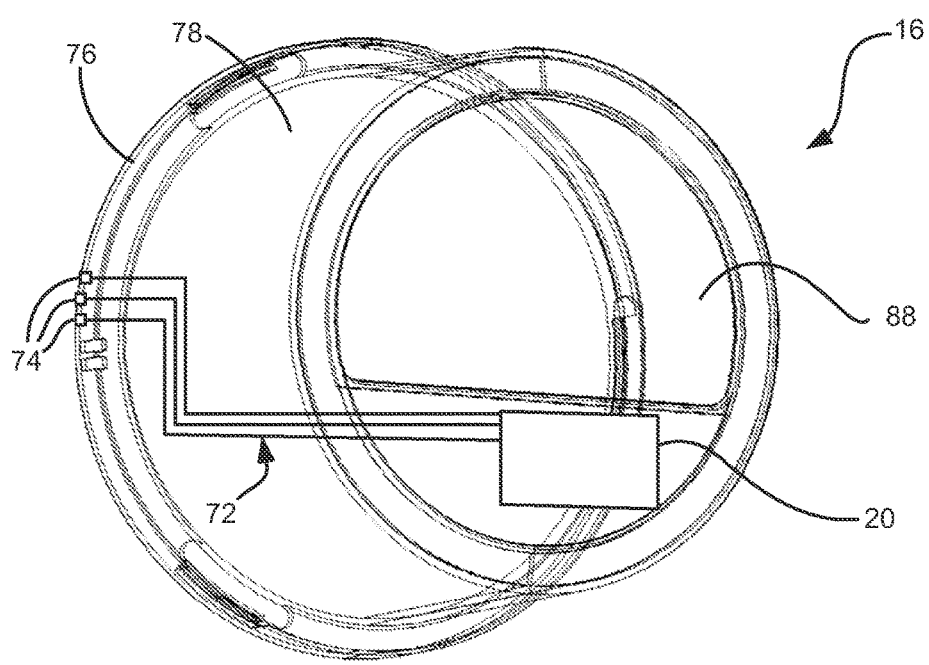
FIG. 7 is a rear perspective view of a cover for a socket based revenue meter in accordance with an embodiment of present disclosure.
Figure 8:
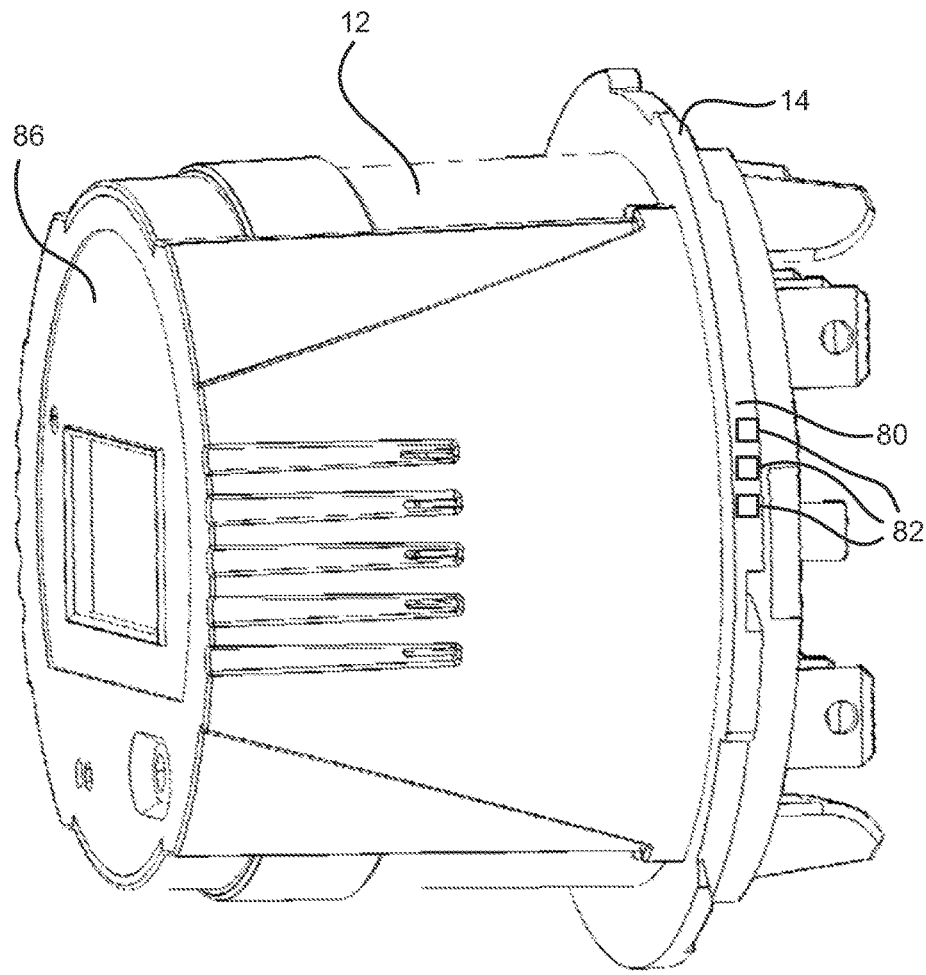
FIG. 8 is a side perspective view of a socket based revenue meter with a cover removed in accordance with an embodiment of present disclosure.
Figure 9:
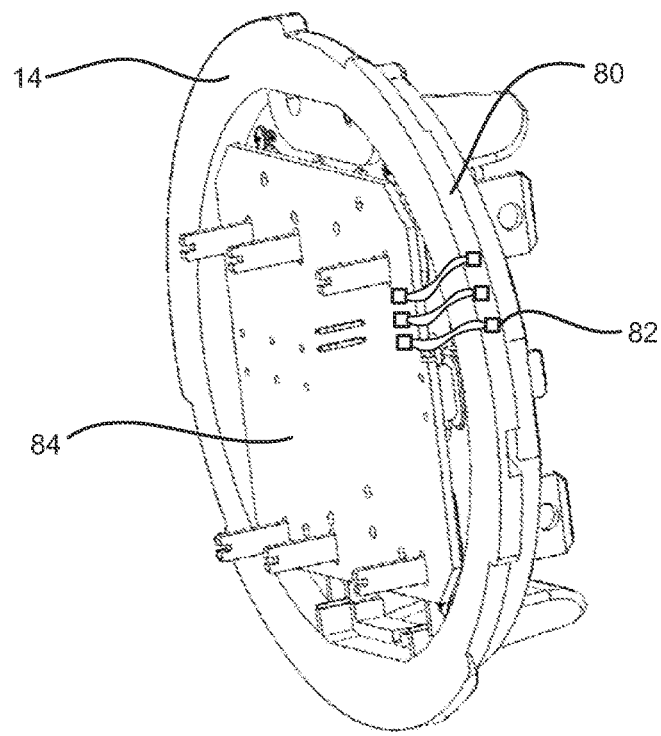
FIG. 9 is a front perspective view of a base for a socket based revenue meter in accordance with an embodiment of present disclosure.
Figure 10:
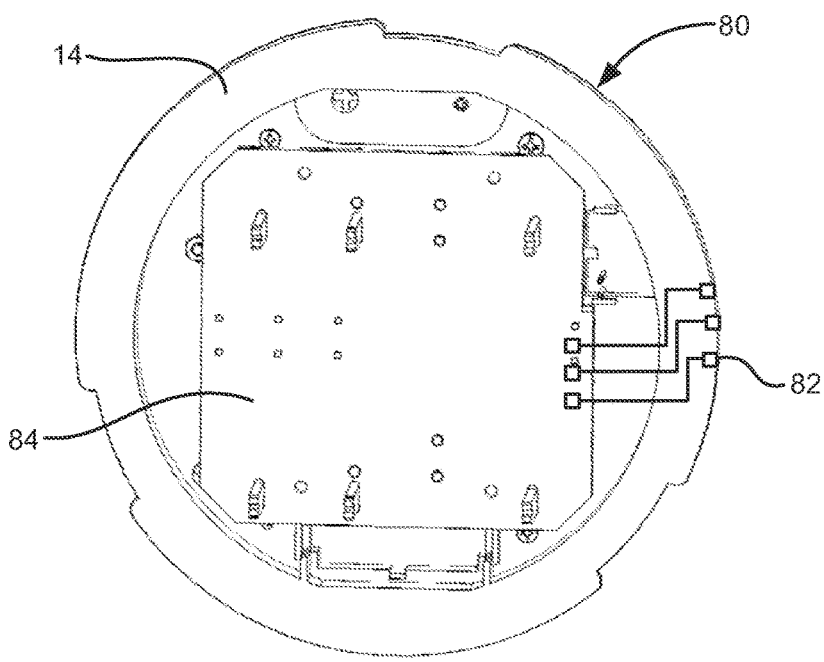
FIG. 10 is a front view of the base shown in FIG. 9 in accordance with an embodiment of present disclosure.

FIG. 3 is a front view of the cover 16 for a socket based revenue meter 10, while FIG. 4 is a rear view of the cover 16 in accordance with an embodiment of present disclosure. As shown in FIG. 3, the interface 20 includes a plurality of input sensors 60. The plurality of input sensors 60 are in electrical communication with internal electronics of the meter to control the display 18 and enter values, commands, etc. for controlling the meter 10. In the embodiment shown, the input sensors are configured as a wheel 62, a first key 64, a second key 66 and a slider 68. It is to be appreciated that the sensors shown are merely exemplary and may take various other forms.

As shown in FIG. 4, the plurality of sensors 60 are applied to an internal face 70 of the cover 16. The cover 16 is made from a clear material, such as glass, plastic, etc., so the inputs sensors can be viewed through the closed end of the cover 16. In one embodiment, the sensors 60 are touch sensing type sensors, e.g., capacitive type sensors, or other type of sensor that does not require direct (i.e., galvanic) contact between, for example, a finger of a user and the internal circuitry of the meter. Here, the cover 16 acts like a dielectric between the finger of a user and the sensors. As will be explained in more detail below, a user or operator of the meter may merely touch the outside surface of the cover 16 in the approximate vicinity of the user interface 20 to engage the user interface 20 and manipulate the meter 10. In this manner, the cover 16 does not need to have any openings nor does it need to be removed to access the user interface to, for example, retrieve data, input configuration changes, etc. Since the cover 16 does not need to have any openings for the input sensors, weather and other environmental conditions do not sacrifice safety nor affect the reliability of the meter.

As mentioned above, the plurality of input sensors 60 are in electrical communication with internal electronics of the meter to control the display 18 and enter values, commands, etc. for controlling the meter 10. Referring to FIGS. 5-10, at least one electrical trace 72 is provided to couple the interface 20 to the internal electronics of the meter 10. The at least one electrical trace 72 is coupled on one end to the interface 20 and, on the other end, terminates on at least one contact 74 that is disposed on a rim 76 of the open end of the cover 16. The at least one electrical trace 72 is disposed on an inner surface of a cylindrical portion 78 of the cover 16. When the cover 16 is disposed over the metering housing 12, the rim 76 of the cover 16 is coupled to an outer peripheral edge 80 of the base 14. The outer peripheral edge 80 of the base 14 includes at least one complementary contact 82 which will make contact with the at least one contact 74 when the cover 16 is secured to the base 12. The at least one complementary contact 82 is electrically coupled to at least one circuit board 84 or other circuitry of the meter.

It is to be appreciated that the at least one contact 74 and/or the at least one complementary contact 82 may be a resilient type contact to allow for a wide range of tolerance in the dimension between the cover 16 and the base 14 to ensure an electrical connection. The resilient type contact may include, but is not limited to, a leaf spring type contact, a brush type contact, a wipe type contact, a ball-and-spring type contact, etc.

In another embodiment, the traces 72 may be printed on the inner surface of the cylindrical portion 78 of the cover 16 with highly transparent conductive ink. In this embodiment, the at least one trace 72 not need be galvanically (DC) connected to a contact on the base 14 but can be done via capacitive or inductive coupling through a non-conductive gap, e.g., air. In this embodiment, the at least one contact 74 would come to rest, when the cover 16 is coupled to the base 14, in close proximity to the least one complementary contact 82 on the outer peripheral edge 80 of the base 14. As described above, the capacitively or inductively coupled connection would allow for a wide range of tolerance in the dimension between the cover 16 and the base 14 to ensure an electrical connection. Furthermore, this "contact-less" type connection will not wear out upon repeated mounting and removal of the cover 16 nor will the contacts oxidize. In a further embodiment, the cylindrical portion 78 of the cover 16 may be shielded on the outer surface, e.g., with a transparent material, to prevent false signals when a user or operator touches the cylindrical portion 78 of the cover 16 near the traces 72.

Figure 11:
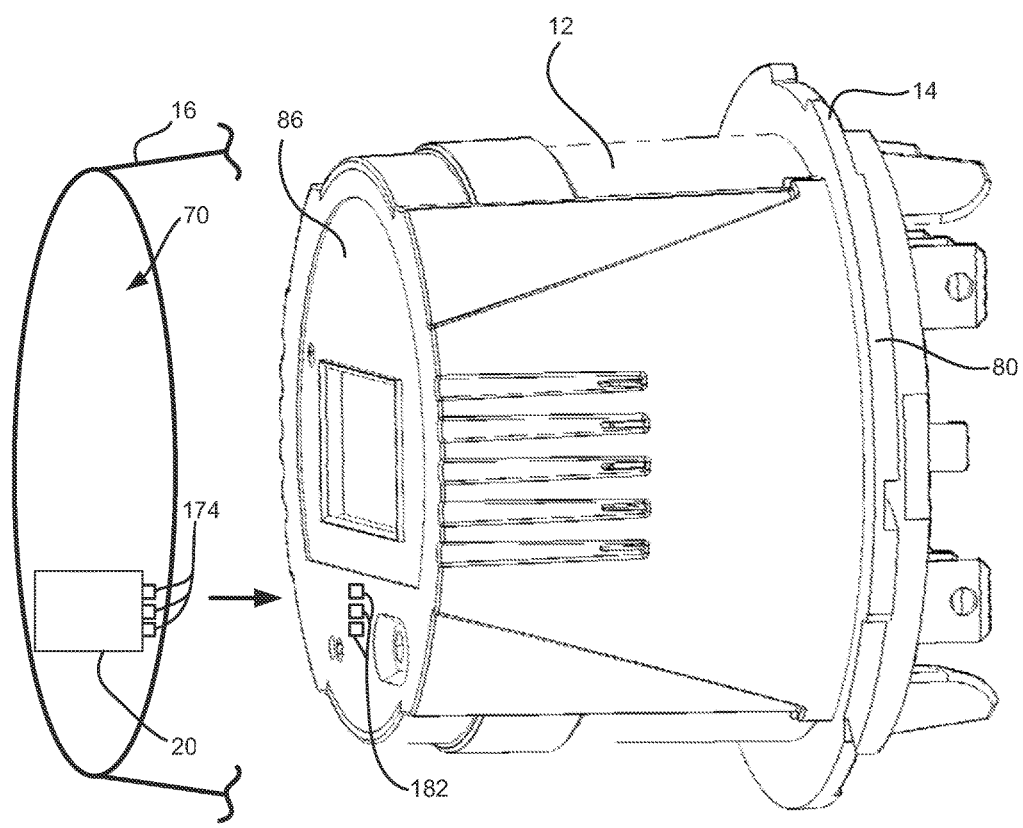
FIG. 11 is a side perspective view of a socket based revenue meter with a cover removed in accordance with another embodiment of present disclosure.

In a further embodiment, the at least one complementary contact may be disposed on a front surface of the meter housing approximately behind the portion of the rear surface of the cover including the interface. Referring to FIG. 11, the at least one complementary contact 182 is disposed on the front surface or face 86 of the housing 12. As can be seen in FIG. 11, the at least one complementary contact 182 is disposed of the front face 86 of the housing approximately behind the portion of the rear surface 70 of the cover 16 including the interface 20. Here, only a portion of the cover 16 is shown for clarity. In this manner, when the cover 16 is coupled to the base 80, the interface 20 aligns approximately in front of the at least one complementary contact 182. At least one contact 174 is provided on a rear surface of the interface 20 to be coupled to the at least one complementary contact 182 eliminating the need for traces or conductors disposed along the inner surface of the cover 16. As described above, the at least one complementary contact 182 is further coupled to components disposed in the housing 12, e.g., a CPU, processor, microprocessor, input/output interface, etc. Furthermore, it is to be appreciated that the at least one contact 174 and/or the at least one complementary contact 182 may be a resilient type contact to allow for a wide range of tolerance in the dimension between the rear surface 70 of the cover 16 and the front surface or face 86 of the housing 12 to ensure an electrical connection. The resilient type contact may include, but is not limited to, a leaf spring type contact, a brush type contact, a wipe type contact, a ball-and-spring type contact, etc.

Figure 12A:
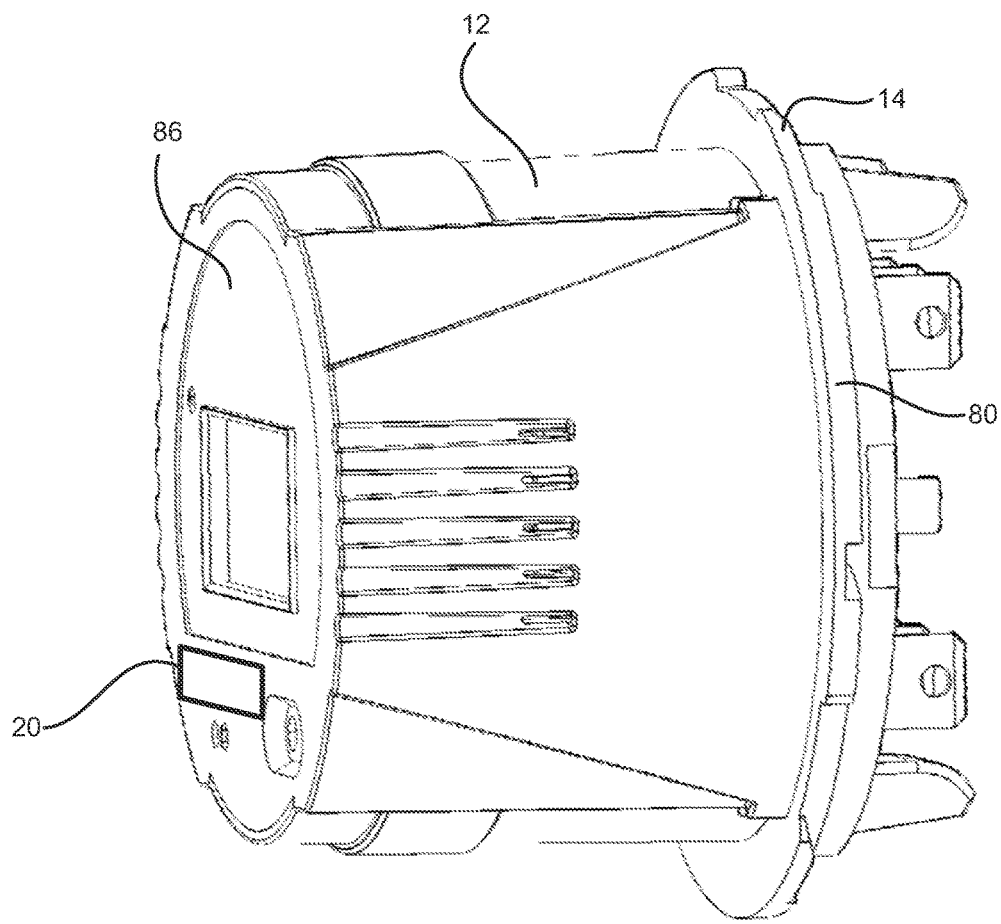
FIG. 12A is a side perspective view of a socket based revenue meter with a cover removed in accordance with a further embodiment of present disclosure.
Figure 12B:
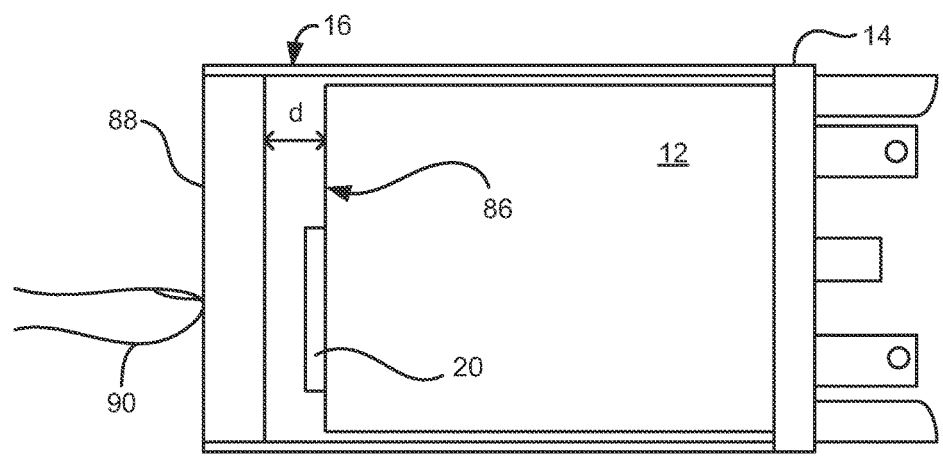
FIG. 12B is a side view of the meter shown in FIG. 12A with a cover disposed thereon in accordance with an embodiment of the present disclosure.

In another embodiment, the interface 20 may be disposed directly on the front surface or face 86 of the housing 12, as shown in FIGS. 12A and 12B. In this embodiment, when the cover 16 is coupled to the base 14, the circular, front portion 88 of the cover 16 is within a predetermined distance d to the front surface 86 of the housing 12. A user's finger 90 can then interact with the interface 20 via capacitive or inductive coupling through a non-conductive gap, e.g., air, the material of the cover 16, etc., by merely touching the outer surface of the front portion 88 of the cover 16. In certain embodiments, the circular, front portion 88 of the cover 16 touches the front surface 86 of the housing 12 when the cover 16 is coupled to the base 80.

Figure 13:
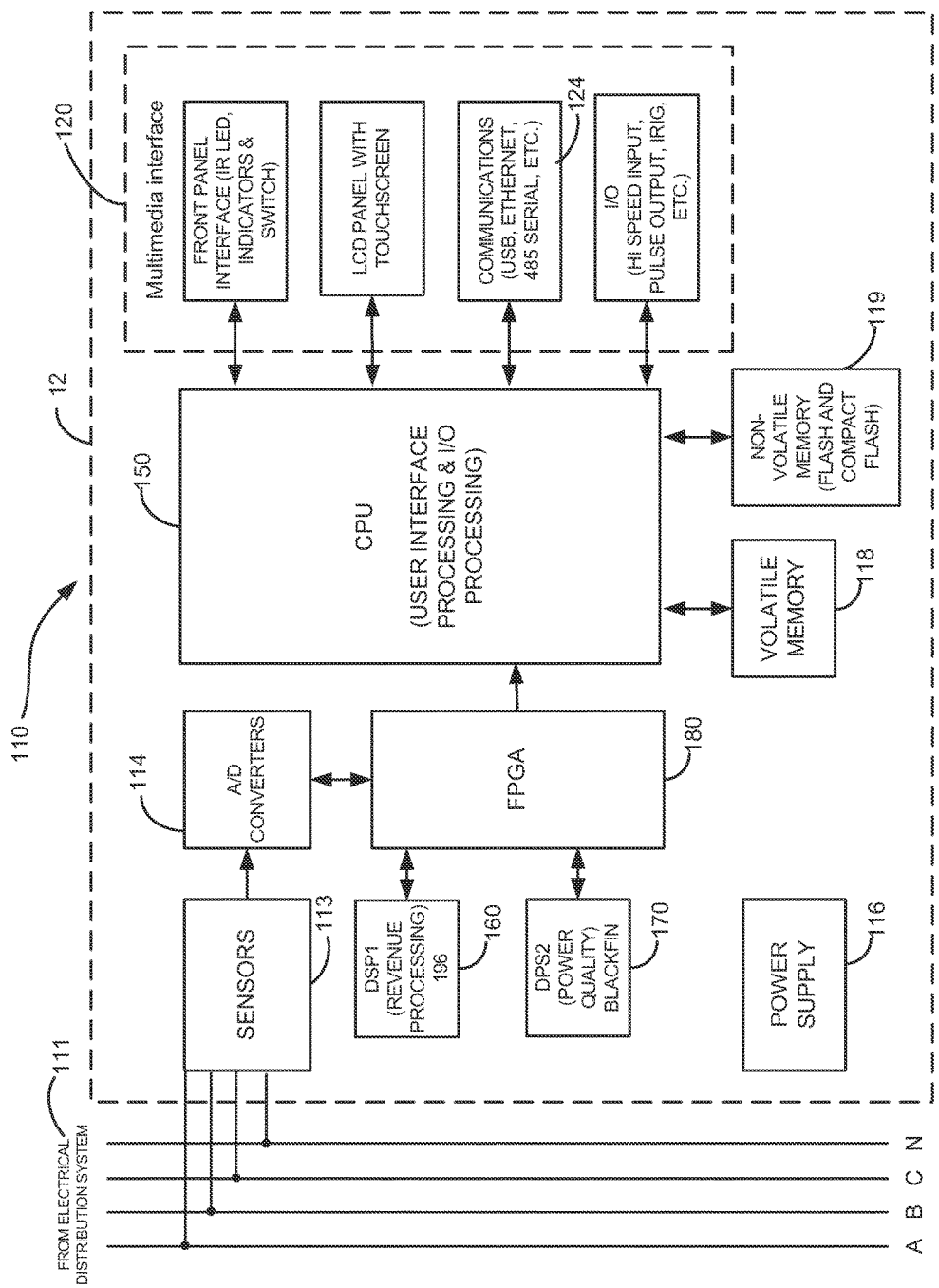
FIG. 13 is a block diagram of an intelligent electronic device in accordance with an embodiment of the present disclosure.

FIG. 13 is a block diagram of an intelligent electronic device (IED) 110 for monitoring and determining power usage and power quality for any metered point within a power distribution system, for providing a data transfer system for faster and more accurate processing of revenue and waveform analysis and for providing audible and visual indications to a user.

The IED 110 of FIG. 13 includes a plurality of sensors 113 coupled to various phases A, B, C and neutral N of an electrical distribution system 111, a plurality of analog-to-digital (A/D) converters 114, including inputs coupled to the sensor 113 outputs, a power supply 116, a volatile memory 118, an non-volatile memory 119, a multimedia user interface 120, and a processing system that includes at least one central processing unit (CPU) 150 (or host processor) and one or more digital signal processors, two of which are shown, i.e., DSP1 160 and DSP2 170. The IED 110 also includes a Field Programmable Gate Array 180 which performs a number of functions, including, but not limited to, acting as a communications gateway for routing data between the various processors 150, 160, 170, receiving data from the A/D converters 114, performing transient detection and capture and performing memory decoding for CPU 150 and the DSP processor 160. In one embodiment, the FPGA 180 is internally comprised of two dual port memories to facilitate the various functions. It is to be appreciated that the various components shown in FIG. 13 are contained within housing 12.

The plurality of sensors 113 sense electrical parameters, e.g., voltage and current, on incoming lines, (i.e., phase A, phase B, phase C, neutral N), from an electrical power distribution system 111, e.g., an electrical circuit. In one embodiment, the sensors 113 will include current transformers and potential transformers, wherein one current transformer and one voltage transformer will be coupled to each phase of the incoming power lines. A primary winding of each transformer will be coupled to the incoming power lines and a secondary winding of each transformer will output a voltage representative of the sensed voltage and current. The output of each transformer will be coupled to the A/D converters 114 configured to convert the analog output voltage from the transformer to a digital signal that can be processed by the CPU 150, DSP1 160, DSP2 170, FPGA 180 or any combination thereof.

A/D converters 114 are respectively configured to convert an analog voltage output to a digital signal that is transmitted to a gate array, such as Field Programmable Gate Array (FPGA) 180. The digital signal is then transmitted from the FPGA 180 to the CPU 150 and/or one or more DSP processors 160, 170 to be processed in a manner to be described below.

The CPU 150 or DSP Processors 160, 170 are configured to operatively receive digital signals from the A/D converters 114 (see FIG. 13) to perform calculations necessary to determine power usage and to control the overall operations of the IED 110. In some embodiments, CPU 150, DSP1 160 and DSP2 170 may be combined into a single processor, serving the functions of each component. In some embodiments, it is contemplated to use an Erasable Programmable Logic Device (EPLD) or a Complex Programmable Logic Device (CPLD) or any other programmable logic device in place of the FPGA 180. In some embodiments, the digital samples, which are output from the A/D converters 114 are sent directly to the CPU 150 or DSP processors 160, 170, effectively bypassing the FPGA 180 as a communications gateway.

The power supply 116 provides power to each component of the IED 110. In one embodiment, the power supply 116 is a transformer with its primary windings coupled to the incoming power distribution lines and having windings to provide a nominal voltage, e.g., 5 VDC, +12 VDC and −12 VDC, at its secondary windings. In other embodiments, power may be supplied from an independent power source to the power supply 116. For example, power may be supplied from a different electrical circuit or an uninterruptible power supply (UPS).

In one embodiment, the power supply 116 can be a switch mode power supply in which the primary AC signal will be converted to a form of DC signal and then switched at high frequency, such as, for example, 100 Khz, and then brought through a transformer to step the primary voltage down to, for example, 5 Volts AC. A rectifier and a regulating circuit would then be used to regulate the voltage and provide a stable DC low voltage output. Other embodiments, such as, but not limited to, linear power supplies or capacitor dividing power supplies are also contemplated.

The multimedia user interface 120 is shown coupled to the CPU 150 in FIG. 13 for interacting with a user and for communicating events, such as alarms and instructions to the user. The multimedia user interface 120 may include the touch sensitive buttons or sensors as described above and a display for providing visual indications to the user. The display may be embodied as a touch screen, a liquid crystal display (LCD), a plurality of LED number segments, individual light bulbs or any combination. The display may further be embodied as an electronic paper (e-paper) or electronic ink (e-ink) display using various technologies such as Gyricon, electrophoretics, electrowetting, electrofluidics, interferometric modulators and other to be developed technologies. The display may provide information to the user in the form of alpha-numeric lines, computer-generated graphics, videos, animations, etc. The multimedia user interface 120 further includes a speaker or audible output means for audibly producing instructions, alarms, data, etc. The speaker is coupled to the CPU 150 via a digital-to-analog converter (D/A) for converting digital audio files stored in a memory 118 or non-volatile memory 119 to analog signals playable by the speaker. The interface 120 may include the functions and components disclosed and described in commonly owned pending U.S. application Ser. No. 11/589,381, entitled "POWER METER HAVING AUDIBLE AND VISUAL INTERFACE", which claims priority to expired U.S. Provisional Patent Appl. No. 60/731,006, filed Oct. 28, 2005, the contents of which are hereby incorporated by reference in their entireties.

The IED 110 will support various file types including but not limited to Microsoft Windows Media Video files (.wmv), Microsoft Photo Story files (.asf), Microsoft Windows Media Audio files (.wma), MP3 audio files (.mp3), JPEG image files (.jpg, .jpeg, .jpe, .jfif), MPEG movie files (.mpeg, .mpg, .mpe, .m1v, .mp2v .mpeg2), Microsoft Recorded TV Show files (.dvr-ms), Microsoft Windows Video files (.avi) and Microsoft Windows Audio files (.wav).

The IED 110 further comprises a volatile memory 118 and a non-volatile memory 119. In addition to storing audio and/or video files, volatile memory 118 will store the sensed and generated data for further processing and for retrieval when called upon to be displayed at the IED 110 or from a remote location. The volatile memory 118 includes internal storage memory, e.g., random access memory (RAM), and the non-volatile memory 119 includes removable memory such as magnetic storage memory; optical storage memory, e.g., the various types of CD and DVD media; solid-state storage memory, e.g., a CompactFlash card, a Memory Stick, SmartMedia card, MultiMediaCard (MMC), SD (Secure Digital) memory; or any other memory storage that exists currently or will exist in the future. By utilizing removable memory, an IED can be easily upgraded as needed. Such memory will be used for storing historical trends, waveform captures, event logs including timestamps and stored digital samples for later downloading to a client application, web-server or PC application.

In a further embodiment, the IED 110 will include a communication device 124, e.g., a network interface, for enabling communications between the IED or meter, and a remote terminal unit, programmable logic controller and other computing devices, microprocessors, a desktop computer, laptop computer, other meter modules, etc. The communication device 124 may be a modem, network interface card (NIC), wireless transceiver, etc. The communication device 124 will perform its functionality by hardwired and/or wireless connectivity. The hardwire connection may include but is not limited to hard wire cabling e.g., parallel or serial cables, RS232, RS485, USB cable, fiber optic cabling, Firewire (1394 connectivity) cables, Ethernet, and the appropriate communication port configuration. The wireless connection will operate under any of the various wireless protocols including but not limited to Bluetooth™ interconnectivity, infrared connectivity, radio transmission connectivity including computer digital signal broadcasting and reception commonly referred to as Wi-Fi or 802.11.X (where x denotes the type of transmission), satellite transmission or any other type of communication protocols, communication architecture or systems currently existing or to be developed for wirelessly transmitting data including spread spectrum 900 MHz, or other frequencies, Zigbee™ WiFi™, or any mesh enabled wireless communication.

The IED 110 may communicate to a server or other computing device via the communication device 124. The IED 110 may be connected to a communications network, e.g., the Internet, by any means, for example, a hardwired or wireless connection, such as dial-up, hardwired, fiber optic connection, cable, DSL, satellite, cellular, PCS, wireless transmission (e.g., 802.11a/b/g), etc. It is to be appreciated that the network may be a local area network (LAN), wide area network (WAN), the Internet or any network that couples a plurality of computers to enable various modes of communication via network messages. Furthermore, the server will communicate using various protocols such as Transmission Control Protocol/Internet Protocol (TCP/IP), File Transfer Protocol (FTP), Hypertext Transfer Protocol (HTTP), etc. and secure protocols such as Hypertext Transfer Protocol Secure (HTTPS), Internet Protocol Security Protocol (IPSec), Point-to-Point Tunneling Protocol (PPTP), Secure Sockets Layer (SSL) Protocol, etc. The server will further include a storage medium for storing a database of instructional videos, operating manuals, data logs, revenue billing data, etc.

The sensed and/or generated data of the IED can also be pushed up to a host software server via FTP, e-mail, SMTP or other such Internet protocol. Such push capability allows the IED or meter to capture data, such as a load profile, alarms or real time voltage, frequency, current, power or energy, and push the data out on a user-defined period, by an internal schedule, an alarm or randomly. Such push capability allows an IED to avoid firewalls by utilizing open ports to send out data as opposed to requiring host software to investigate the IED. The data being pushed by the IED may be configured in various formats, including but not limited to, XML, CSV, HTML, XLS, Hex, binary, etc. Other file formats are contemplated to be within the scope of the present disclosure.

In an additional embodiment, the IED 110 will also have the capability of not only digitizing waveforms, but storing the waveform and transferring that data upstream to a central computer, e.g., a remote server, when an event occurs such as, but not limited to, a voltage surge or sag or a current short circuit. This data will be triggered and captured on an event, stored to memory, e.g., non-volatile RAM, and additionally transferred to a host computer within the existing communication infrastructure either immediately in response to a request from a remote device or computer to receive said data in response to a polled request. The digitized waveform will also allow the CPU 150 to compute other electrical parameters such as harmonics, magnitudes, symmetrical components and phasor analysis. Using the harmonics, the IED 110 will also calculate dangerous heating conditions and can provide harmonic transformer derating based on harmonics found in the current waveform.

In a further embodiment, the IED 110 will execute an e-mail client and will send e-mails to the utility or to the customer direct on an occasion that a power quality event occurs. Such an e-mail may constitute an alarm and may also constitute a load profile or other types of data; this data may or may not be additional to the basic data of the alarm condition. This allows utility companies to dispatch crews to repair the condition. The data generated by the IEDs or meters are use to diagnose the cause of the condition. The data is transferred through the infrastructure created by the electrical power distribution system. The email client will utilize a POP3 or other standard mail protocol. A user will program the outgoing mail server and email address into the meter. An exemplary embodiment of a meter employing such an e-mail client is disclosed in U.S. Pat. No. 6,751,563, which all contents thereof are incorporated by reference herein.

The techniques of the present disclosure can be used to automatically maintain program data and provide field wide updates upon which IED firmware and/or software can be upgraded. An event command can be issued by a user, on a schedule or by digital communication that will trigger the IED 110 to access a remote server and obtain the new program code. This will ensure that program data will also be maintained allowing the user to be assured that all information is displayed identically on all units.

Figure 14:
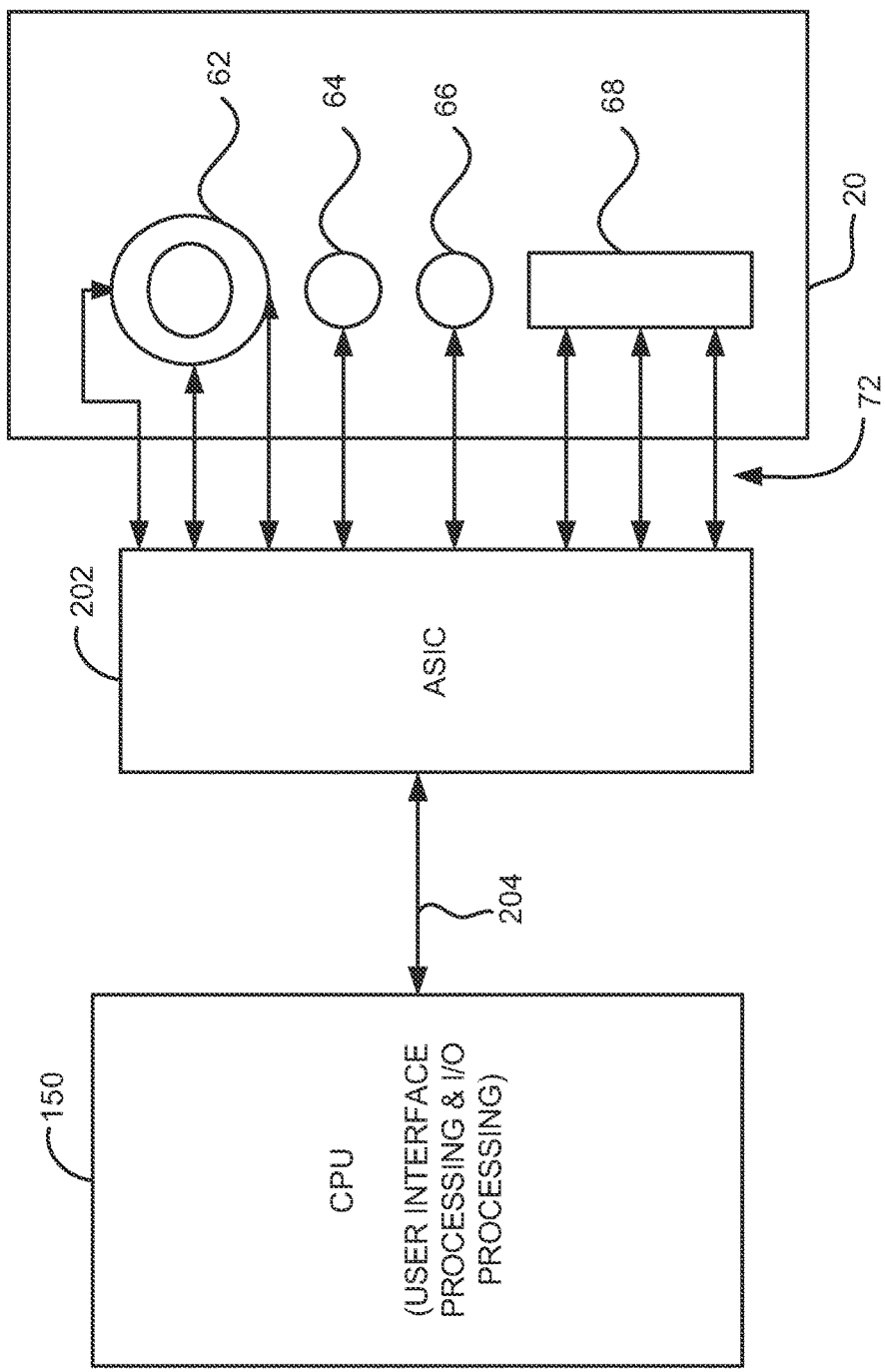
FIG. 14 is a block diagram of a touch user interface in accordance with an embodiment of the present disclosure.

In one embodiment, the user interface 20 is configured with charge-transfer capacitive sensors. Referring to FIG. 14, each sensor 62, 64, 66, 68 is coupled to a user interface controller 202, e.g., an application specific integrated circuit (ASIC), via the traces 72 which are disposed on the inner surface of the cover 16. In this embodiment, the sensors (or electrodes) 62, 64, 66, 68 may be constructed from any electrically conductive material including, but not limited to, copper, silver, carbon, Indium tin oxide (ITO), etc. The user interface controller 202 detects near-proximity or touch on from each of the sensors (or electrodes) 62, 64, 66, 68 and provides this input to the CPU 150 of the meter via a communication bus 204, e.g., a Serial Peripheral Interface (SPI) bus. By providing a voltage to each sensor (or electrode) 62, 64, 66, 68 via the user interface controller 202, each sensor (or electrode) 62, 64, 66, 68 can project a sense field through the cover 16 which acts like a dielectric. In this manner, merely touching the outer surface of the cover 16 corresponding to a location of the sensor will provide an input to the user interface controller 202.

It is to be appreciated that the sensors 62, 64, 66, 68 may be coupled to the user interface controller 202 without the traces 72 when the IED 10, 110 is configured as in FIGS. 11, 12A and 12B.

In one embodiment, each sensor (or electrode) 62, 64, 66, 68 may be constructed from a clear material, for example, by a screen printing process, embossing process, etc. Optionally, one of the sensor (electrodes) may be employed as a proximity sensor. In this embodiment, upon detecting a user via the proximity sensor, a backlight may be activated. In certain embodiments, an area behind each sensor (or electrode) 62, 64, 66, 68 may be back lit to indicate to the user where the sensors are, i.e., where the user may place their finger.

In another embodiment, the user interface of the present disclosure employs surface capacitance sensing to interface with the meter 10, 110. In this embodiment, a conductive layer or material is disposed on the inner surface 70 of the cover 16, e.g., in the shape of a square or rectangle. A small voltage is applied to this layer, resulting in a uniform electrostatic field. When a conductor, such as a human finger, touches the uncoated surface, i.e., the outer surface of the cover 16, a capacitor is dynamically formed. Due to the resistance of the surface of the cover 16, each corner is measured to have a different effective capacitance. A controller can determine the location of the touch indirectly from the change in the capacitance as measured from the four corners of the layer, i.e., the larger the change in capacitance, the closer the touch is to that corner. Alternatively, it is to be appreciated that the conductive layer may be applied to the front face 86 of the housing 12.

Figure 15:
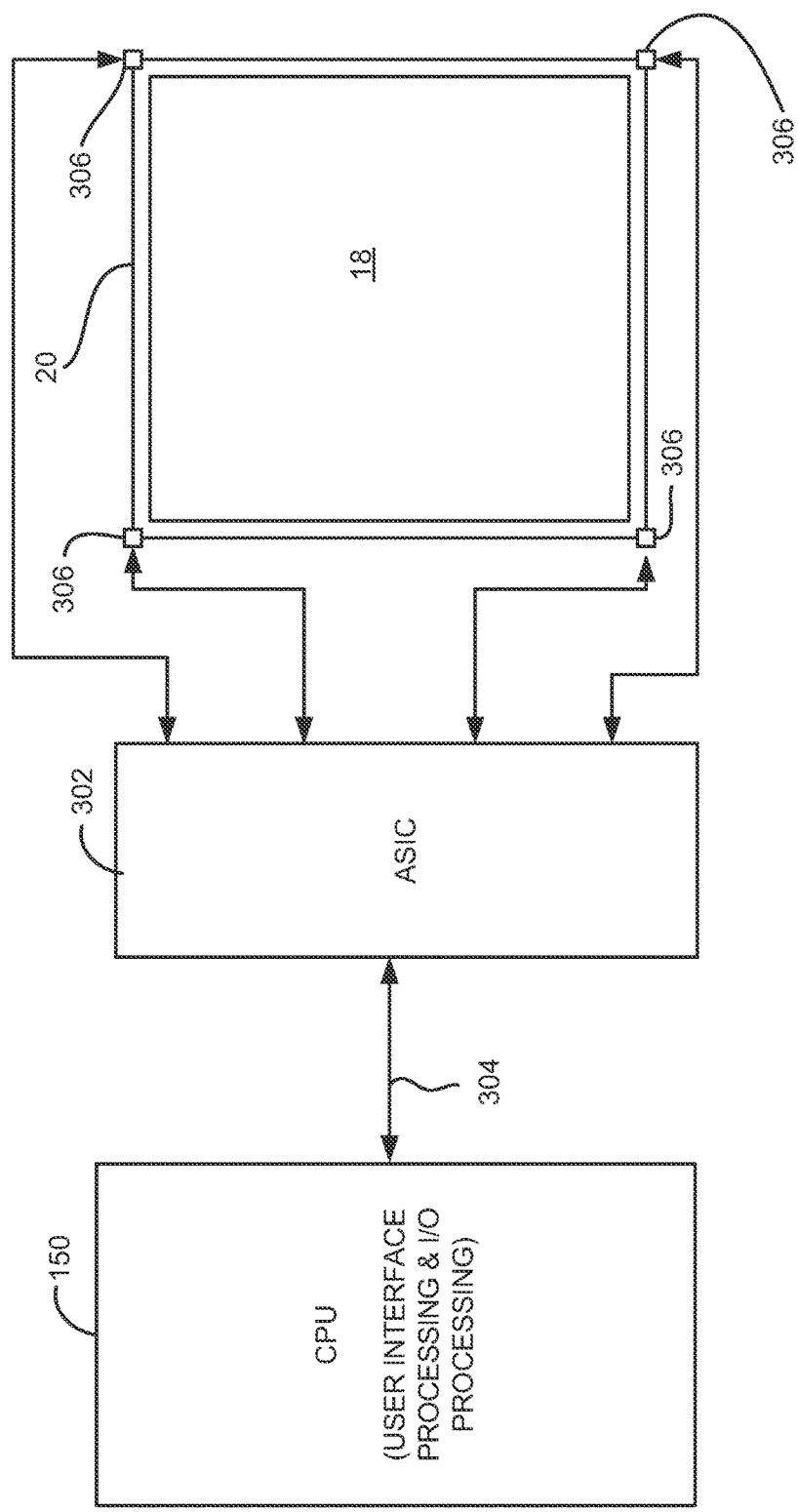
FIG. 15 is a block diagram of a touch user interface in accordance with another embodiment of the present disclosure.

In one embodiment, the user interface 20 is employed in conjunction with the display 18. Referring to FIG. 15, the user interface 20 is configured as a rectangular touch area to be disposed over the display 18. In this embodiment, a conductive layer or material is disposed on the inner surface 70 of the cover 16 as the touch area 20. A small voltage is applied to this layer. When a user touches the outer surface of the cover 16, a capacitor is dynamically formed. Due to the resistance of the surface of the cover 16, each corner is measured, via a sensor 306, to have a different effective capacitance. A controller 302 can determine the location of the touch indirectly from the change in the capacitance as measured from the four corners of the panel via sensors 306. In this embodiment, the display 18 may segment portions of the display to indicate to the user where they can touch to initiate an interaction. In this embodiment, separate sensors, as shown in FIG. 14, would not be required. The display may be configured to replicate the sensors and provide the same functionality in conjunction with the touch area 20.

It is to be appreciated that the sensors 306 may communicate to the internal circuitry of the IED via traces as described above. Alternatively, the front face 86 of the housing 12 may include contacts for coupling the sensors 306 to the internal circuitry. In another embodiment, the rectangular touch area may be disposed directly on the front face 86 of the housing 12 so when the cover 16 is disposed over the housing 12, the circular, front portion 88 of the cover 16 is within a predetermined distance to the rectangular touch area to enable touch sensing; in this embodiment, no sensors are disposed on the cover 16.

Figure 16:
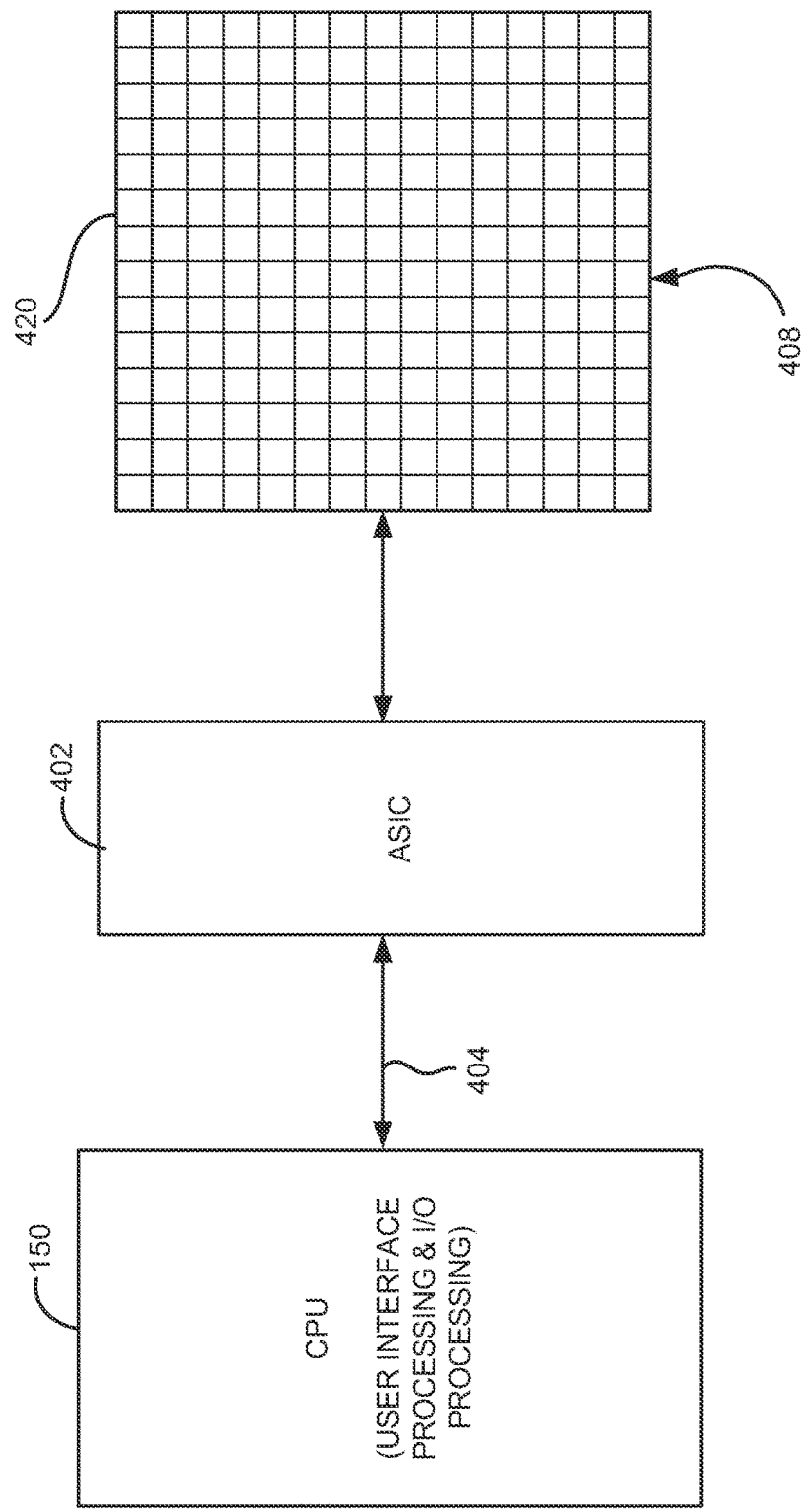
FIG. 16 is a block diagram of a touch user interface in accordance with a further embodiment of the present disclosure.

In a further embodiment, the meter 10, 110 of the present disclosure employs projected capacitance sensing to interface with the meter 10, 110. In this embodiment, an X-Y grid is, for example, formed either by etching one layer to form a grid pattern 408 of electrodes, or by etching two separate, perpendicular layers of conductive material with parallel lines or tracks to form the grid as a touch area 420 on the inner surface 70 of the cover 16, as shown in FIG. 16. The controller 402 then charges and monitors the grid 408. As charge is pulled by a finger from an area in the grid 408, the controller 402, e.g., an ASIC, is made aware of the location of the finger, which gets interpreted into a mouse or cursor position or point of touch on the display 18. Alternatively, the layers may be formed on a substrate which is applied directly or indirectly to the front face 86 of the housing 12.

Depending on the implementation, an active or passive stylus can be used instead of or in addition to a finger. Gloved fingers may or may not be sensed, depending on the implementation and gain settings.

It is to be appreciated that there are two types of projected capacitive touch: self capacitance and mutual capacitance. Mutual capacitive sensors have a capacitor at each intersection of each row and each column of the grid. A 12-by-16 array, for example, would have 192 independent capacitors. A voltage is applied to the rows or columns. Bringing a finger or conductive stylus near the surface of the sensor changes the local electric field which reduces the mutual capacitance. The capacitance change at every individual point on the grid can be measured to accurately determine the touch location by measuring the voltage in the other axis. Mutual capacitance allows multi-touch operation where multiple fingers, palms or styli can be accurately tracked at the same time. Self-capacitance sensors can have the same X-Y grid as mutual capacitance sensors, but the columns and rows operate independently. With self-capacitance, current senses the capacitive load of a finger on each column or row.

In another embodiment, the user interface 20 may employ resistive technology to sense a touch of a user. A resistive panel including several layers is configured with at least two thin, transparent electrically-resistive layers separated by a thin space. These layers face each other with a thin gap between. The top screen, or layer, (the screen that is touched) has a coating on the underside surface of the screen. Just beneath it is a similar resistive layer on top of its substrate. One layer has conductive connections along its sides, the other along top and bottom. A voltage is applied to one layer, and sensed by the other. When an object, such as a fingertip or stylus tip, presses down on the outer surface, the two layers touch to become connected at that point. The panel then behaves as a pair of voltage dividers, one axis at a time. By rapidly switching between each layer, the position of a pressure on the screen can be read. It is to be appreciated that the resistive panel may be analog or digital. Additionally, as only sufficient pressure is necessary for the touch to be sensed, the resistive type user interface may be used with gloves on, or by using anything rigid as a finger/stylus substitute.

In a further embodiment, optical technologies may be employed for the touchscreen of the user interface, in which two or more image sensors are placed around the edges (e.g., the corners) of the screen. Infrared back lights are placed in the camera's field of view on the other side of the screen. A touch shows up as a shadow and each pair of cameras can then be pinpointed to locate the touch or even measure the size of the touching object. In one such optical implementation, an infrared touchscreen uses an array of X-Y infrared LED and photodetector pairs around the edges of the screen to detect a disruption in the pattern of LED beams. These LED beams cross each other in vertical and horizontal patterns, which helps the sensors pick up the exact location of the touch. Such a system can detect essentially any input including a finger, gloved finger, stylus or pen, which makes it suitable for outdoor applications, for example, in the case of a socket meter mounted on the side of a house. Unlike capacitive touchscreens, infrared touchscreens do not require any patterning on the glass which increases durability and optical clarity of the overall system. Other exemplary optical technologies which may be employed by the IEDs of the present disclosure include infrared acrylic projection, infrared optical waveguide, digital waveguide touch (DWT), rear diffused illumination (DI), frustrated total internal reflection (FTIR), diffused surface illumination (DSI), laser light plane (LLP), among others.

In another embodiment, the user interface may employ wave technologies, for example, surface acoustic wave (SAW) technology or bending wave touch (BWT) technology. Surface acoustic wave (SAW) technology uses ultrasonic waves that pass over a substrate, e.g., a touchscreen panel. When the panel is touched, a portion of the wave is absorbed. This change in the ultrasonic waves registers the position of the touch event and sends this information to a controller for processing. Bending wave touch (BWT) technology includes dispersive signal touch (DST) technology and acoustic pulse recognition (APR) technology. Dispersive signal touch (DST) technology uses sensors to detect the piezoelectricity in a surface, e.g., glass, that occurs due to a touch. Algorithms then interpret this information and provide the actual location of the touch. Since mechanical vibrations are used to detect a touch event, any object can be used to generate these events, including fingers and stylus. In acoustic pulse recognition (APR), a touch at any one position on a surface of the user interface generates a sound wave in the substrate which then produces a unique combined sound after being picked up by three or more tiny transducers attached to the edges of the touchscreen. The sound is then digitized by the controller and compared to a list of pre-recorded sounds for every position on the surface. The cursor position is instantly updated to the touch location. A moving touch is tracked by rapid repetition of this process. Extraneous and ambient sounds are ignored since they do not match any stored sound profile. The technology differs from other attempts to recognize the position of touch with transducers or microphones in using a simple table look-up method, rather than requiring powerful and expensive signal processing hardware to attempt to calculate the touch location without any references.

In the embodiments which employ a touch area, the CPU 150 and/or the ASIC 302, 402 may be configured to detect and recognize multi-touch or gesture functionality. Here, the CPU 150 and/or the ASIC 302, 402 may be loaded with an algorithm to recognize the presence of two or more points of contacts, e.g., fingers, with the touch area 20, 420 to implement advanced functionality. For example, the touch area 20, 420 may sense a tap of a single finger to select, or highlight, an item displayed via display 18. It is to be appreciated that the touch area and cover are transparent to enable viewing of the display 18 which is disposed on the housing 12. In other words, the touch area 20, 420 is generally aligned over the display 18 so the display 18 may indicate to the user where to touch the touch area to implement the various described functionality.

Figure 17A:
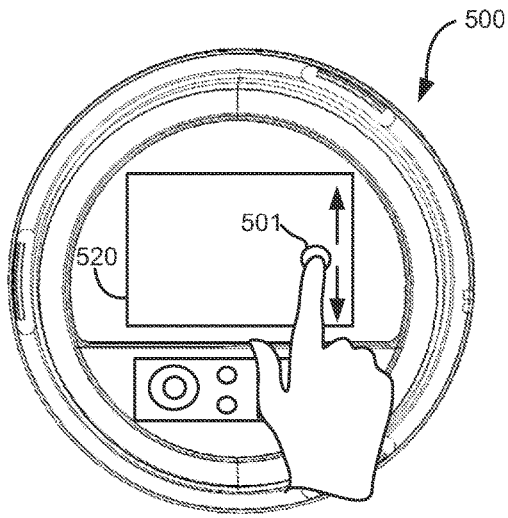
FIGS. 17A-17D illustrate exemplary multi-touch gestures in accordance with the present disclosure.
Figure 17B:
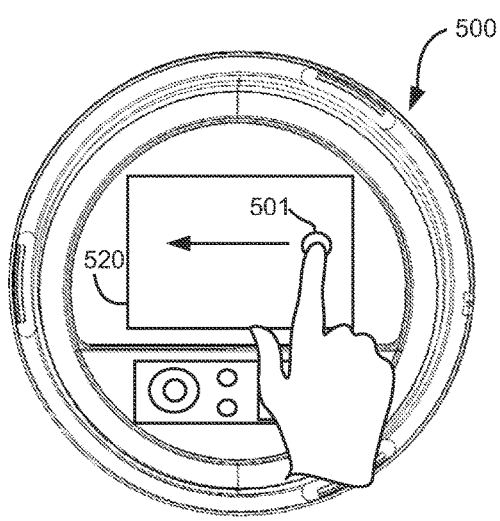
Figure 17C:
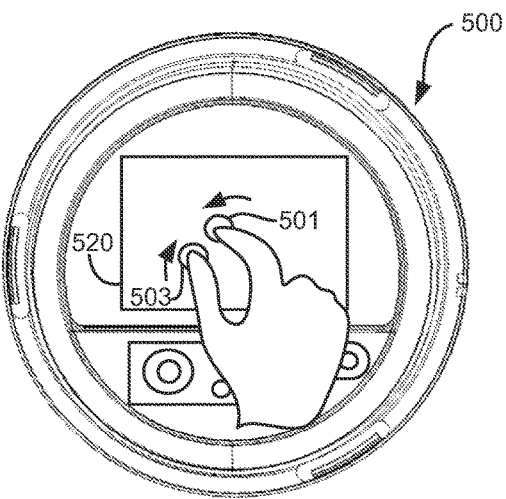
Figure 17D:
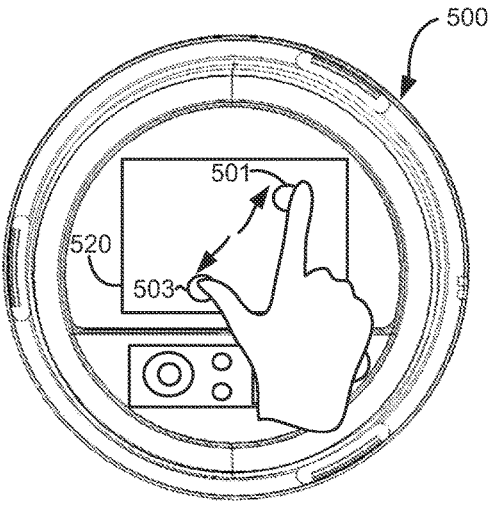

In another example, the touch area 20, 420 may sense a double tap of a single finger to activate a program or to advance to another screen or menu. In a further example, as shown in FIG. 17A, the touch area 520 of IED 500 may sense a single finger, or single point of contact 501, which is maintained on the touch area 520 and moved in an up and down direction, as indicated by the arrows, to scroll the screen being presented via the display. Additionally, a maintained finger on the touch area may pan the screen being displayed if moved in several different directions along the touch area. In another example, a user may flick or swipe a single finger, or single point of contact 501, across the touch area 520, i.e., in a side-to-side direction, to move to a next screen, as shown in FIG. 15B.

In a further example, the touch area 520 may sense two points of contact 501, 503, e.g., two fingers, moving toward each other in a pinching motion to reduce the size of the information being displayed to show more information at one particular time, as shown in FIG. 15C. Conversely, the touch area 520 may sense two points of contact 501, 503 moving away from each other in a spreading motion to zoom into the information being displayed, as shown in FIG. 15D.

It is to be appreciated that the gestures or multi-touch operations listed above are merely exemplary and are not meant to be an exhaustive list. Therefore, many other gestures or multi-touch operations, either developed or to be developed, are to be considered to be within the scope of the present disclosure.

To reduce interference received from the power mains, the sense detection time of the user interface controller 202, 302, 402 may be scheduled or configured to detect inputs synchronously to the power mains, e.g., at a low energy state, approximately a zero crossing time of the power waveform or other states when the interference is at a minimum level.

In another embodiment, the user interface controller 202, 302, 402 may include an auto-calibration module. The auto-calibration module periodically calibrates the controller and/or sensors to accommodate for changed environmental conditions, e.g., temperature fluctuations, dust, moisture on the cover surface, etc. In this embodiment, the meter 10, 110 may optionally include various environmental sensors either within the housing 12, between the housing 12 and cover 16 or located externally of the cover 16. When located externally, the environmental sensors may be wired to the internal electronics of the meter, e.g., through the housing 12 or base 14, or may communicate wirelessly via various wireless communication protocols including, but not limited to, Bluetooth™, WIFI™, ZigBee™, etc.

It is to be understood that the present disclosure may be implemented in various forms of hardware, software, firmware, special purpose processors, or a combination thereof. The IED 10, 110 also includes an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, or firmware, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

It is to be appreciated that the various features shown and described herein are interchangeable, that is, a feature shown in one embodiment may be incorporated into another embodiment.

While non-limiting embodiments are disclosed herein, many variations are possible which remain within the concept and scope of the present disclosure. Such variations would become clear to one of ordinary skill in the art after inspection of the specification, drawings and claims herein. The present disclosure therefore is not to be restricted except within the spirit and scope of the appended claims.

Figure 18A:
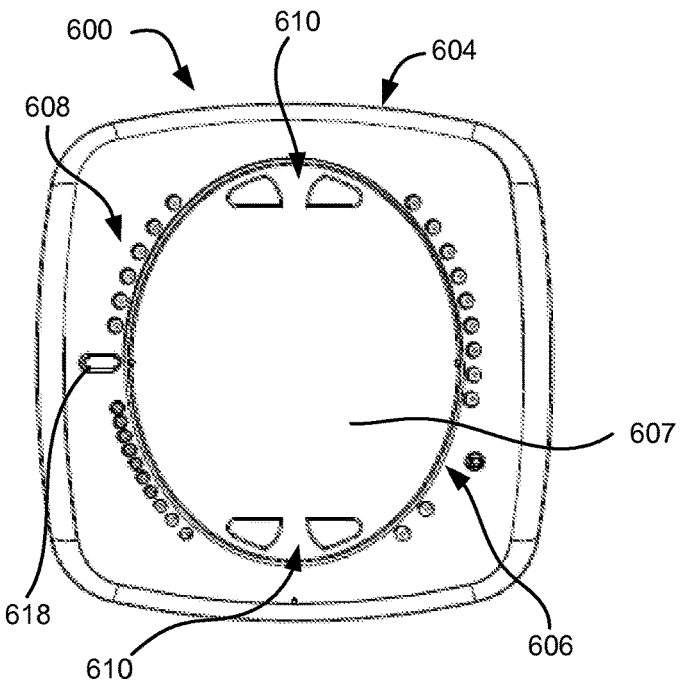
FIGS. 18A-18F illustrate exemplary form factors for an intelligent electronic device (IED) in accordance with an embodiment of the present disclosure.
Figure 18B:
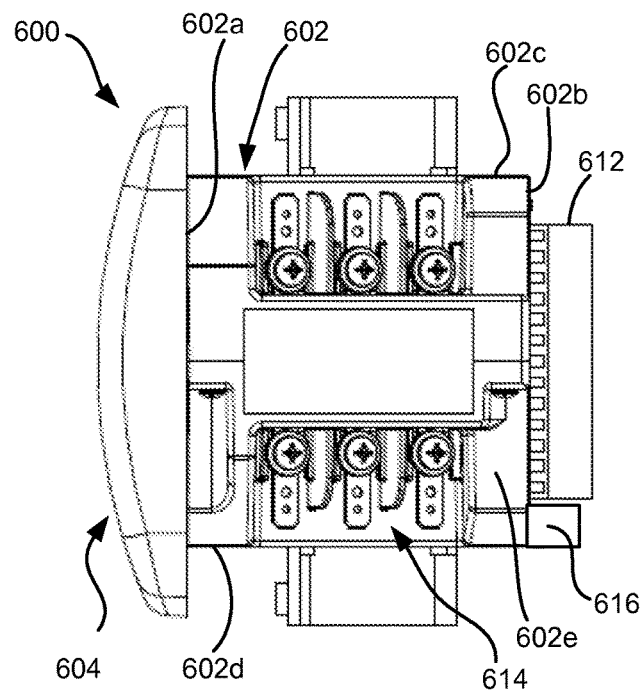

For example, it is to be appreciated that the components and devices of the various described IEDs may be disposed in various housings depending on the application or environment. For example, the IED may be configured as a panel meter 600 as shown in FIGS. 18A and 18B. An exemplary panel meter is described in commonly owned U.S. Pat. No. 7,271,996, the contents of which are hereby incorporated by reference. As seen in FIGS. 18A and 18B, the IED 600 includes a housing 602 defining a front surface 602a, a rear surface 602b, a top surface 602c, a bottom surface 602d, a right side surface 602e, and a left side surface (not shown). Electrical device 600 includes a face plate 604 operatively connected to front surface 602a of housing 602. Face plate 604 includes displays 606, indicators 608 (e.g., LEDs and the like), buttons 610, and the like providing a user with an interface for visualization and operation of electrical device 600. For example, as seen in FIG. 18A, face plate 604 of electrical device 600 includes analog and/or digital displays 606 capable of producing alphanumeric characters. In one embodiment, the display 606 is configured as a user interface in accordance with any of the previously described embodiments. For example, in one embodiment, the display 606 includes a transparent cover 607, e.g., a glass cover, with the user interface applied to the internal face surface of the cover 607. Alternatively, the user interface may be supported internally in the housing 602 with the cover 607 disposed over the user interface within a predetermined distance to enable the user interface to sense touch applied to the cover 607.

Additionally, the face plate 604 includes a plurality of indicators 608 which, when illuminated, indicate to the user the "type of reading", the "% of load bar", the "parameter designation" which indicates the reading which is being displayed on displays 606, a "scale selector" (e.g., Kilo or Mega multiplier of Displayed Readings), etc. Face plate 604 includes a plurality of buttons 610 (e.g., a "menu" button, an "enter" button, a "down" button, a "right" button, etc.) for performing a plurality of functions, including and not limited to: viewing of meter information; enter display modes; configuring parameters; performing re-sets; performing LED checks; changing settings; viewing parameter values; scrolling parameter values; and viewing limit states. The housing 602 includes voltage connections or inputs 612 provided on rear surface 602b thereof, and current inputs 614 provided along right side surface 602e thereof. The IED 600 may include a first interface or communication port 616 for connection to a master and/or slave device. Desirably, first communication port 616 is situated in rear surface 602b of housing 602. IED 600 may also include a second interface or communication port 618 situated on face plate 604.

Figure 18C:
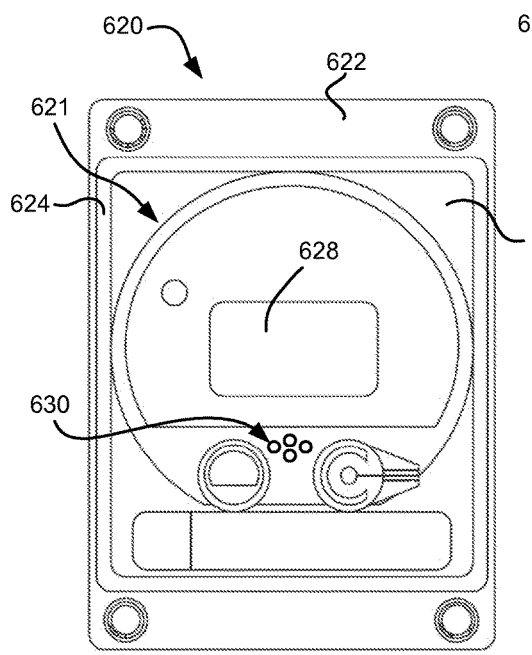
Figure 18D:
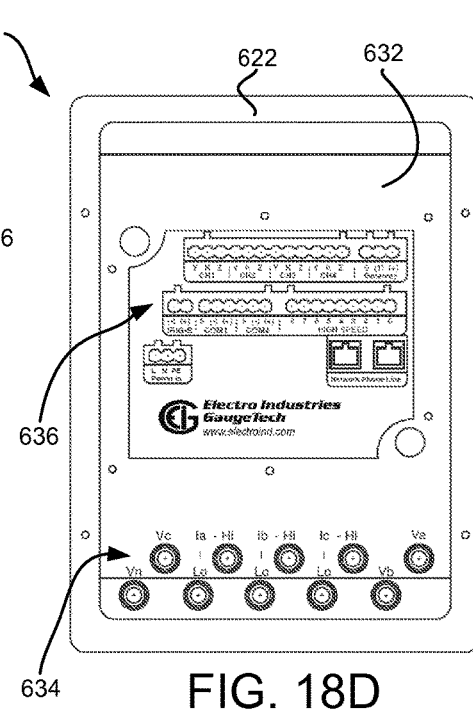

In a further embodiment, the IED 621 may be disposed in a switchboard or draw-out type housing 620 as shown in FIGS. 18C and 18D, where FIG. 18C is a front view and FIG. 18D is a rear view. The switchboard enclosure 622 features a cover 624 with a transparent face 626 to allow the meter display 628 disposed on the housing 621 to be read and the user interface 630 to be interacted with by the user. It is to be appreciated that a user interface in accordance with the present disclosure may be applied to an internal facing surface of the transparent face 626 or applied to the front face of the housing 621. The cover 624 also has a sealing mechanism (not shown) to prevent unauthorized access to the meter. A rear surface 632 of the switchboard enclosure 622 provides connections for voltage and current inputs 634 and for various communication interfaces 636. Although not shown, the meter disposed in the switchboard enclosure 622 may be mounted on a draw-out chassis which is removable from the switchboard enclosure 622. The draw-out chassis interconnects the meter electronics with the electrical circuit. The draw-out chassis contains electrical connections which mate with matching connectors 634, 636 disposed on the rear surface 632 of the enclosure 622 when the chassis is slid into place.

Figure 18E:
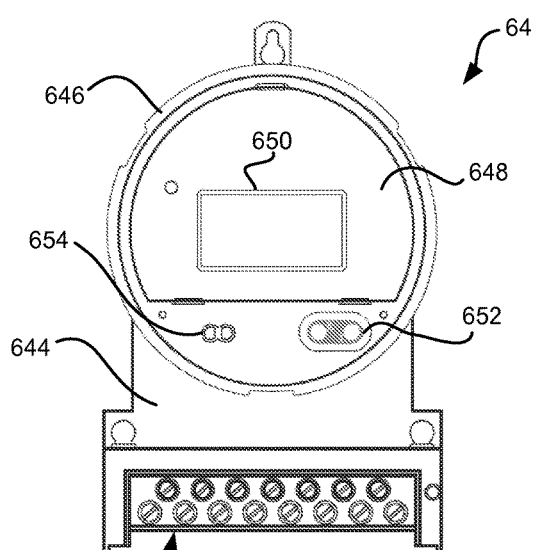
Figure 18F:
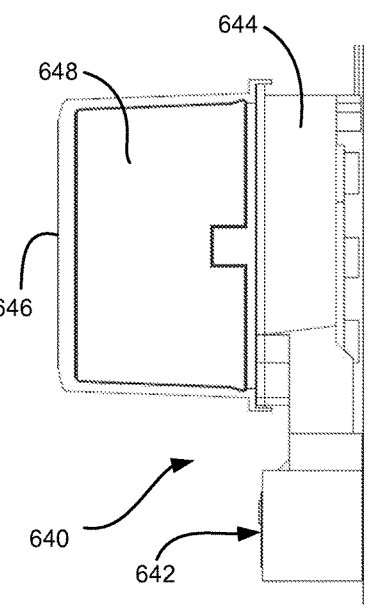

In yet another embodiment, the IED of the present disclosure may be disposed in a A-base or type A housing as shown in FIGS. 18E and 18F. A-base meters 640 feature bottom connected terminals 642 on the bottom side of the meter housing 644. These terminals 642 are typically screw terminals for receiving the conductors of the electric circuit (not shown). A-base meters 640 further include a meter cover 646, meter body 648, a display 650 and input/output means 652. It is to be appreciated that a user interface in accordance with the present disclosure may be applied to an internal facing surface of the cover 646 or applied to the front face of the meter body 648. Further, the meter cover 646 includes an input/output interface 654. The cover 646 encloses the meter electronics 648 and the display 650. The cover 646 has a sealing mechanism (not shown) which prevents unauthorized tampering with the meter electronics.

It is to be appreciated that other housings (e.g., a protective relay, programmable logic controller, etc.) and mounting schemes (e.g., circuit breaker mounted, etc.) are contemplated to be within the scope of the present disclosure.

Furthermore, although the foregoing text sets forth a detailed description of numerous embodiments, it should be understood that the legal scope of the present disclosure is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. § 112, sixth paragraph.

What is claimed is:

1. An intelligent electronic device for monitoring power usage of an electrical circuit of a power distribution system comprising:
    a housing including a surface, the surface including at least one first contact disposed thereon;
    a transparent cover removably disposed over at least a portion of the housing;
    at least one sensor disposed in the housing and coupled to the electric circuit and configured to measure at least one parameter of the electrical circuit and generate at least one analog signal indicative of the at least one parameter;
    at least one analog to digital converter disposed in the housing and coupled to the at least one sensor and configured to receive the at least one analog signal and convert the at least one analog signal to at least one digital signal;
    at least one processor disposed in the housing and configured to receive the at least one digital signal and calculate at least one power parameter of the electrical circuit;
    a display disposed on a portion of the housing and visible through the transparent cover; and
    a user interface including a plurality of touch sensitive sensors and at least one second contact disposed on a surface of the transparent cover facing the housing, wherein the user interface and display do not overlap as viewed through the transparent cover, the plurality of touch sensitive sensors coupled to the at least one second contact, such that when the transparent cover is disposed over the housing, the at least one second contact and the at least one first contact are electrically coupled, the plurality of touch sensitive sensors configured to detect a user input applied to an outer surface of the transparent cover without removing the transparent cover from the housing, the user interface being coupled to at least one controller via the at least one first contact that determines a location of the user input in relation to the plurality of touch sensitive sensors and tracks movement of the user input from the location along the outer surface of the transparent cover to determine a gesture user input,
    wherein the at least one controller detects the user input at approximately zero crossing times of waveforms of the electric circuit of the power distribution system to reduce interference.

2. The intelligent electronic device as in claim 1, wherein the display is configured to display measured and calculated data.

3. The intelligent electronic device as in claim 1, wherein the at least one touch sensitive sensor is a charge-transfer capacitive sensor.

4. The intelligent electronic device as in claim 1, wherein the at least one touch sensitive sensor is a surface capacitance sensor.

5. The intelligent electronic device as in claim 1, wherein the at least one touch sensitive sensor is a projected capacitance sensor.

6. The intelligent electronic device as in claim 1, wherein the at least one touch sensitive sensor is a resistive sensor.

7. The intelligent electronic device as in claim 1, wherein the at least one touch sensitive sensor is an optical sensor.

8. The intelligent electronic device as in claim 1, wherein the at least one touch sensitive sensor is an acoustic wave sensor.

9. The intelligent electronic device as in claim 1, wherein the housing is selected from the group consisting of a panel meter type housing, a switchboard type meter housing and a A-base type meter housing.

10. The intelligent electronic device as in claim 1, wherein the at least one controller is coupled to the at least one touch sensitive sensor, the at least one controller provides a voltage to the at least one touch sensitive sensor to generate a sense field on the outer surface of the generally cylindrical, transparent cover.

11. The intelligent electronic device as in claim 1, wherein at least one touch sensitive sensor is transparent and disposed over the display when the transparent cover is disposed over the housing.

12. A socket based revenue meter comprising:
    a generally cylindrical housing including a surface, the surface including at least one complementary contact disposed thereon;
    a base coupled to the housing including at least one terminal mateable with matching jaws of a detachable meter mounting device for connecting the meter to a power line of a power distribution system;
    a generally cylindrical, transparent cover having an open end and a closed end, the cover being removably disposed over the housing and the open end being mateable with the base;

at least one sensor disposed in the housing and coupled to at least one terminal configured for measuring at least one parameter of the power line and generating at least one analog signal indicative of the at least one parameter;

at least one analog to digital converter disposed in the housing and coupled to the at least one sensor configured for receiving the at least one analog signal and converting the at least one analog signal to at least one digital signal;

at least one processor disposed in the housing and configured for receiving the at least one digital signal and calculating energy consumption in the electrical circuit;

a display disposed on the surface of the housing and visible through the generally cylindrical, transparent cover; and a user interface disposed on an inner surface of the closed end of the generally cylindrical, transparent cover, the user interface including at least one touch sensitive sensor and at least one contact, the at least one touch sensitive sensor coupled to the at least one contact, such that when the generally cylindrical, transparent cover is disposed over the housing and mated to the base, the at least one contact and the at least one complementary contact are electrically coupled, wherein the at least one touch sensitive sensor is configured to detect a user input applied to an outer surface of the generally cylindrical, transparent cover when the generally cylindrical, transparent cover is mated to the base to enable the user to interact with the display, wherein the user interface is coupled to a user interface controller via the at least one complementary contact, the user interface controller configured to determine a location of the user input in relation to the at least one touch sensitive sensor and tracks movement of the user input from the location along the outer surface of the generally cylindrical, transparent cover to determine a gesture user input, and wherein the user interface controller detects the user input at approximately zero crossing times of waveforms of the power line of the power distribution system to reduce interference.

13. The socket based revenue meter as in claim 12, wherein the at least one touch sensitive sensor is a charge-transfer capacitive sensor.

14. The socket based revenue meter as in claim 12, wherein the at least one touch sensitive sensor is a surface capacitance sensor.

15. The socket based revenue meter as in claim 12, wherein the at least one touch sensitive sensor is a projected capacitance sensor.

16. The socket based revenue meter as in claim 12, wherein the at least one touch sensitive sensor is a resistive sensor.

17. The socket based revenue meter as in claim 12, wherein the at least one touch sensitive sensor is an optical sensor.

18. The socket based revenue meter as in claim 12, wherein the at least one touch sensitive sensor is an acoustic wave sensor.

19. The socket based revenue meter as in claim 12, wherein the user interface controller provides a voltage to the at least one touch sensitive sensor to generate a sense field on the outer surface of the generally cylindrical, transparent cover.

20. The socket based revenue meter as in claim 12, wherein the at least one touch sensitive sensor is transparent and disposed over the display when the transparent cover is disposed over the housing.

21. A socket based revenue meter comprising:

a generally cylindrical housing;

a base coupled to the housing including at least one terminal mateable with matching jaws of a detachable meter mounting device for connecting the meter to a power line of a power distribution system;

a generally cylindrical, transparent cover having an open end and a closed end, the generally cylindrical, transparent cover being removably disposed over the housing and the open end being mateable with the base;

at least one sensor disposed in the housing and coupled to at least one terminal of the base configured for measuring at least one parameter of the power line and generating at least one analog signal indicative of the at least one parameter;

at least one analog to digital converter disposed in the housing and coupled to the at least one sensor configured for receiving the at least one analog signal and converting the at least one analog signal to at least one digital signal;

at least one processor disposed in the housing and configured for receiving the at least one digital signal and calculating energy consumption in the electrical circuit; and a user interface including at least one touch sensitive sensor disposed on an inner surface of the generally cylindrical, transparent cover configured to detect a user input applied to an outer surface of the generally cylindrical, transparent cover, wherein the generally cylindrical, transparent cover includes at least one conductive trace disposed on the inner surface coupling the at least one touch sensitive sensor to at least one contact on a rim of the open end of the generally cylindrical, transparent cover and the base includes at least one complementary contact on an outer peripheral edge of the base for coupling to the at least one contact on the rim of the open end of the generally cylindrical, transparent cover when the generally cylindrical, transparent cover is mated to the base, the at least one complementary contact of the base being electrically coupled to a user interface controller such that the user interface is in communication with the user interface controller, wherein the user interface controller is configured to determine a location of the user input in relation to the at least one touch sensitive sensor and tracks movement of the user input from the location along the outer surface of the generally cylindrical, transparent cover to determine a gesture user input and detects the user input at approximately zero crossing times of waveforms of the power line of the power distribution system to reduce interference.

22. The socket based revenue meter as in claim 21, further comprising a user interface controller coupled to the at least one touch sensitive sensor, the user interface controller provides a voltage to the at least one touch sensitive sensor to generate a sense field on the outer surface of the generally cylindrical, transparent cover.

23. The socket based revenue meter as in claim 21, wherein the at least one complementary contact is configured for making electrical contact with the at least one contact.

24. The socket based revenue meter as in claim 21, wherein the at least one complementary contact is configured for making a contact-less type connection with the at least one contact.

25. The socket based revenue meter as in claim 21, wherein the at least one contact and at least one complementary contact are resilient type contacts.

26. The socket based revenue meter as in claim 21, wherein the at least one conductive trace is transparent conductive ink.

27. The socket based revenue meter as in claim 21, further comprising a display disposed on a surface of the housing, wherein the at least one touch sensitive sensor is transparent and disposed over the display when the transparent cover is disposed over the housing.

28. An intelligent electronic device for monitoring power usage of an electrical circuit of a power distribution system comprising:
- a housing including a surface, the surface including at least one first contact disposed thereon;
- a transparent cover removably disposed over at least a portion of the housing;
- at least one sensor disposed in the housing and coupled to the electric circuit and configured to measure at least one parameter of the electrical circuit and generate at least one analog signal indicative of the at least one parameter;
- at least one analog to digital converter disposed in the housing and coupled to the at least one sensor and configured to receive the at least one analog signal and convert the at least one analog signal to at least one digital signal;
- at least one processor disposed in the housing and configured to receive the at least one digital signal and calculate at least one power parameter of the electrical circuit;
- a display disposed on a portion of the housing and visible through the transparent cover; and
- a user interface including a plurality of touch sensitive sensors and at least one second contact disposed on a surface of the transparent cover facing the housing, the plurality of touch sensitive sensors coupled to the at least one second contact, such that when the transparent cover is disposed over the housing, the at least one second contact and the at least one first contact are electrically coupled, the plurality of touch sensitive sensors configured to detect a user input applied to an outer surface of the transparent cover without removing the transparent cover from the housing, the user interface being coupled to at least one controller via the at least one first contact that determines a location of the user input in relation to the plurality of touch sensitive sensors and tracks movement of the user input from the location along the outer surface of the transparent cover to determine a gesture user input.

29. The intelligent electronic device as in claim 28, wherein the plurality of touch sensitive sensors include at least one of a charge-transfer capacitive sensor, a surface capacitance sensor, a projected capacitance sensor, a resistive sensor, an optical sensor and/or an acoustic wave sensor.

30. The intelligent electronic device as in claim 28, wherein the housing is selected from the group consisting of a panel meter type housing, a switchboard type meter housing and a A-base type meter housing.

31. The intelligent electronic device as in claim 28, further comprising a base coupled to the housing including at least one terminal mateable with matching jaws of a detachable meter mounting device for connecting the intelligent electronic device to the electrical circuit of the power distribution system,
- wherein the cover is a generally cylindrical, transparent cover having an open end and a closed end, the generally cylindrical, transparent cover being removably disposed over the housing with the open end being mateable with the base and the plurality of touch sensitive sensors being disposed on an inner surface of the closed end.

32. The intelligent electronic device as in claim 28, wherein at least one touch sensitive sensor is transparent and positioned on the surface of the transparent cover such that the at least one touch sensitive sensor is disposed over the display when the transparent cover is disposed over the housing.

* * * * *